United States Patent
Lai et al.

(10) Patent No.: US 9,484,353 B1
(45) Date of Patent: Nov. 1, 2016

(54) MEMORY DEVICE AND METHOD FOR FABRICATING THE SAME

(71) Applicant: MACRONIX INTERNATIONAL CO., LTD., Hsinchu (TW)

(72) Inventors: Erh-Kun Lai, Taichung (TW); Wei-Chen Chen, Taoyuan (TW); Dai-Ying Lee, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/803,218

(22) Filed: Jul. 20, 2015

(51) Int. Cl.
| | | |
|---|---|---|
| H01L 27/115 | (2006.01) |
| H01L 21/02 | (2006.01) |
| H01L 29/788 | (2006.01) |
| H01L 21/28 | (2006.01) |
| H01L 29/04 | (2006.01) |
| H01L 29/16 | (2006.01) |

(52) U.S. Cl.
CPC ..... *H01L 27/11556* (2013.01); *H01L 21/0223* (2013.01); *H01L 21/02164* (2013.01); *H01L 21/28273* (2013.01); *H01L 29/04* (2013.01); *H01L 29/16* (2013.01); *H01L 29/7883* (2013.01)

(58) Field of Classification Search
CPC .............. H01L 27/11556; H01L 21/02164; H01L 21/0223; H01L 21/28273; H01L 29/04; H01L 29/16; H01L 29/7883
USPC .......................................................... 257/66
See application file for complete search history.

(56) References Cited

U.S. PATENT DOCUMENTS

| | | | |
|---|---|---|---|
| 2011/0002178 A1 | 1/2011 | Hwang et al. | |
| 2011/0032772 A1 | 2/2011 | Aritome | |
| 2012/0052674 A1* | 3/2012 | Lee ................. | H01L 27/11578 438/591 |
| 2014/0008714 A1* | 1/2014 | Makala ............ | H01L 21/28273 257/324 |
| 2014/0084357 A1* | 3/2014 | Choi ................. | H01L 27/1157 257/324 |
| 2014/0284695 A1* | 9/2014 | Won ................. | H01L 29/7926 257/324 |

(Continued)

FOREIGN PATENT DOCUMENTS

TW 201428895 A 7/2014

OTHER PUBLICATIONS

Noh, et al.: "A New Metal Control Gate Last Process (MCGL process) for High Performance DC-SF (Dual Control gate with Surrounding Floating gate) 3D NAND Flash Memory", 2012 Symposium on VLSI Technology Digest of Technical Papers; pp. 19-20.

(Continued)

*Primary Examiner* — Yasser A Abdelaziez
(74) *Attorney, Agent, or Firm* — McClure, Qualey & Rodack, LLP

(57) ABSTRACT

A memory device includes a first insulating layer, a second insulating layer, an isolation layer, a floating gate electrode, a control gate electrode, a channel layer and a tunneling oxide layer. The second insulating layer is disposed adjacent to and substantially parallel with the first insulating layer to form an interlayer space there between. The isolation layer is disposed in the interlayer space to form a non-straight angle with the first insulating layer, and divides the interlayer space into a first recess and a second recess. The floating gate electrode is disposed in the first recess. The control gate electrode is disposed in the second recess. The channel layer is disposed on an opening surface of the first recess and forms a non-straight angle with the first insulating layer. The tunneling oxide layer is disposed between the channel layer and the floating gate electrode.

14 Claims, 26 Drawing Sheets

(56) References Cited

U.S. PATENT DOCUMENTS

2014/0332875 A1\* 11/2014 Kim .................. H01L 27/11582
257/324
2016/0155750 A1\* 6/2016 Yasuda ............. H01L 27/11582
257/324

OTHER PUBLICATIONS

Seo, et al.: "A Novel 3-D Vertical FG NAND Flash Memory Cell Arrays Using the Separated Sidewall Control Gate (S-SCG) for Highly Reliable MLC Operation"; IEEE Copyright 2011; pp. 61-64.

\* cited by examiner

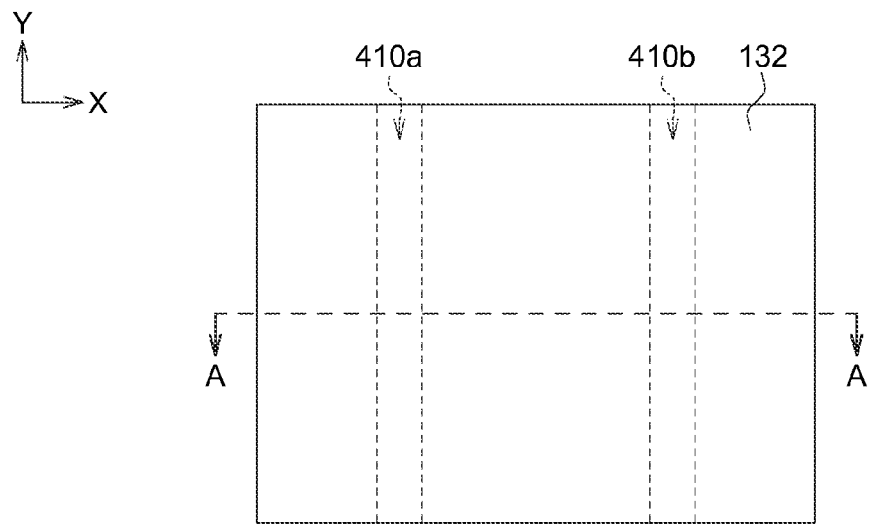
FIG. 4A1
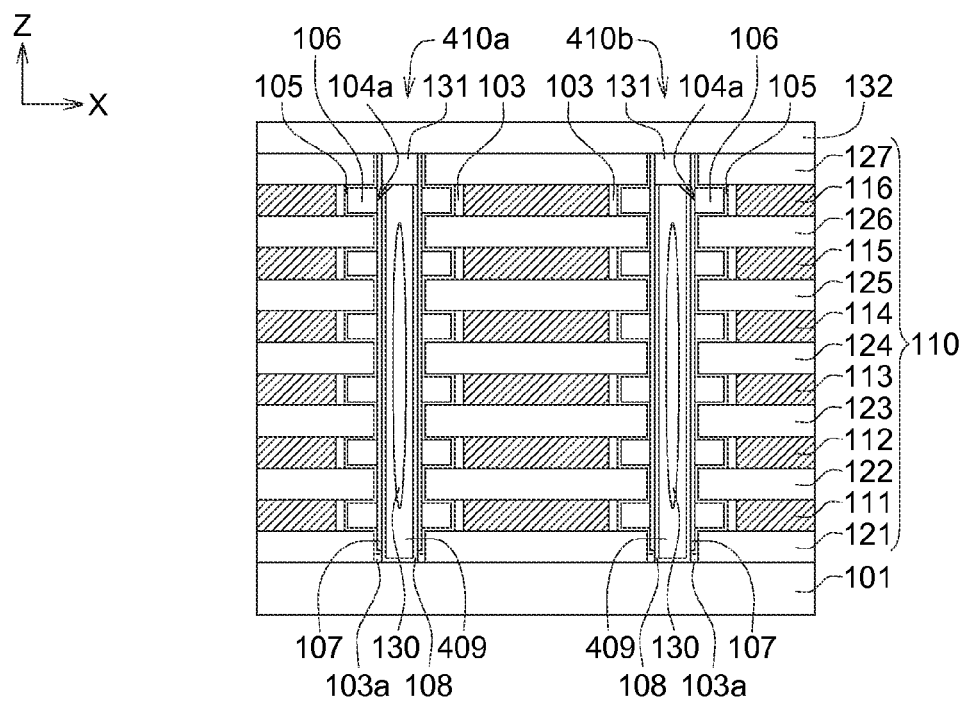
FIG. 4A2

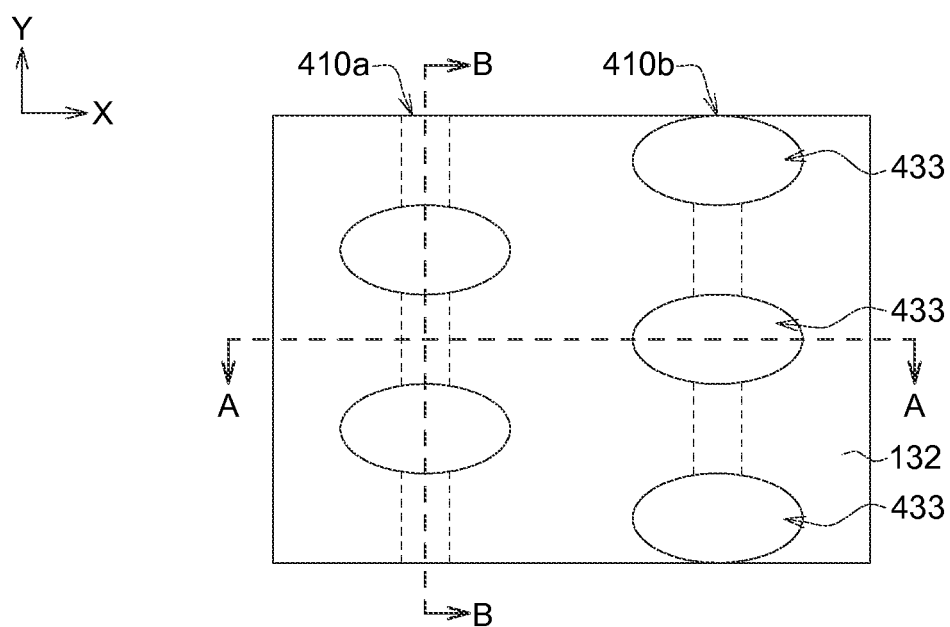
FIG. 4B1

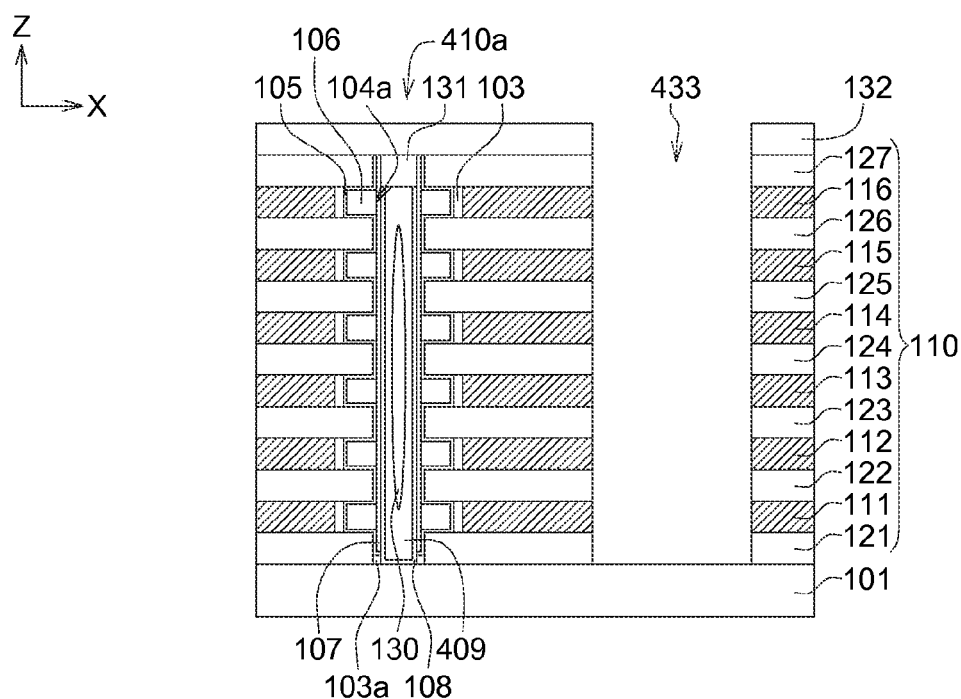
FIG. 4B2
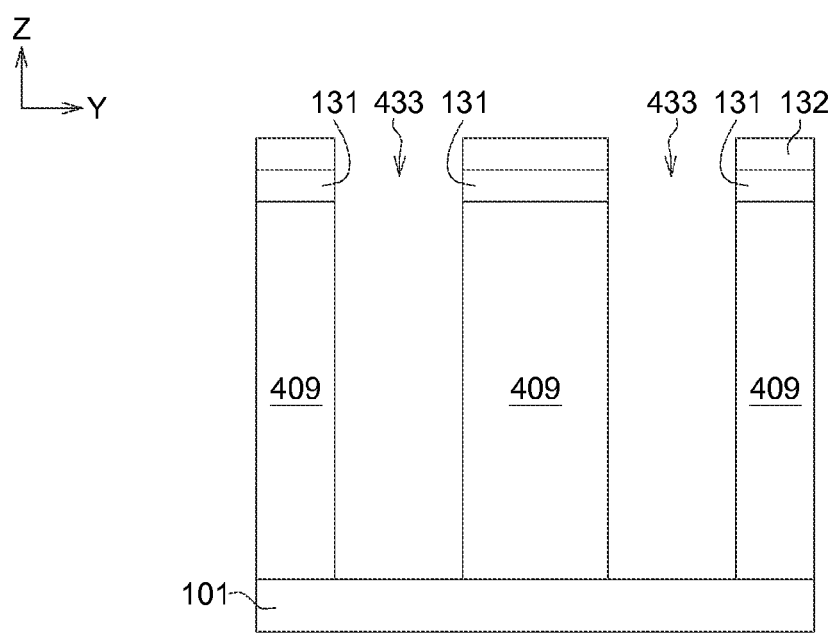
FIG. 4B3

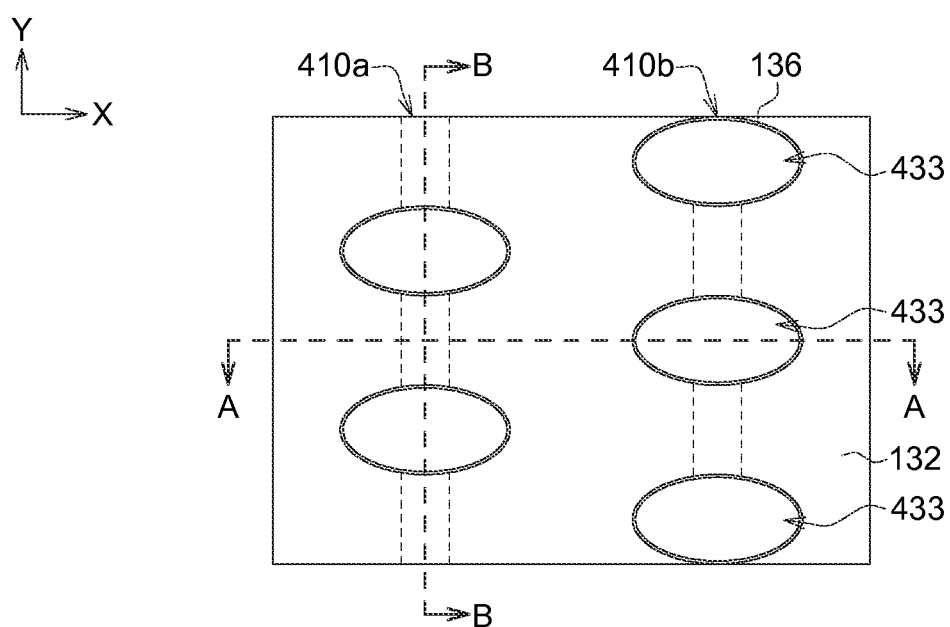
FIG. 4C1

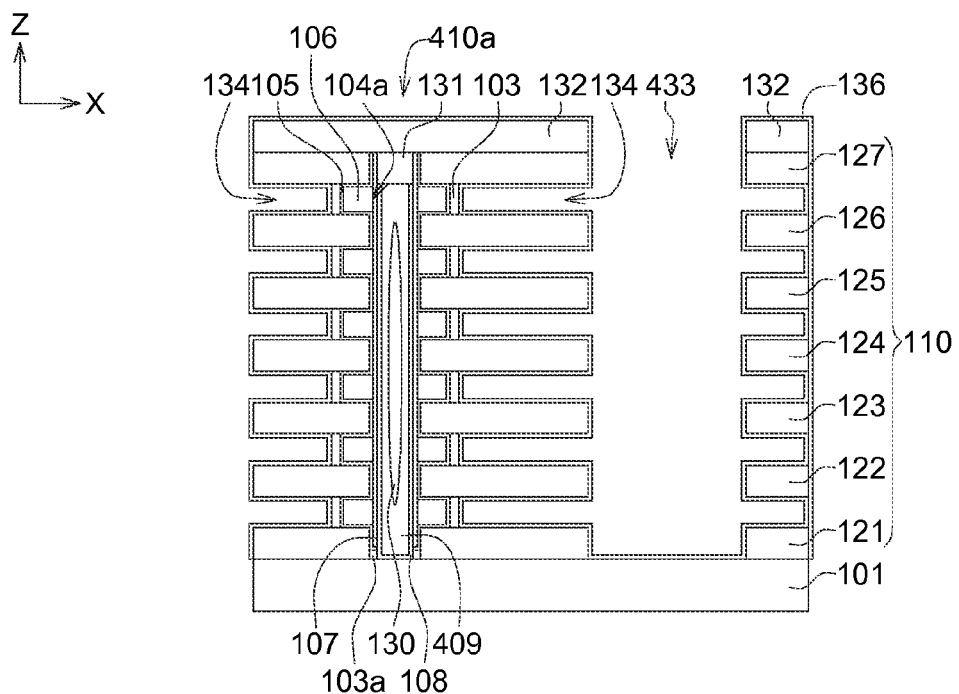
FIG. 4C2
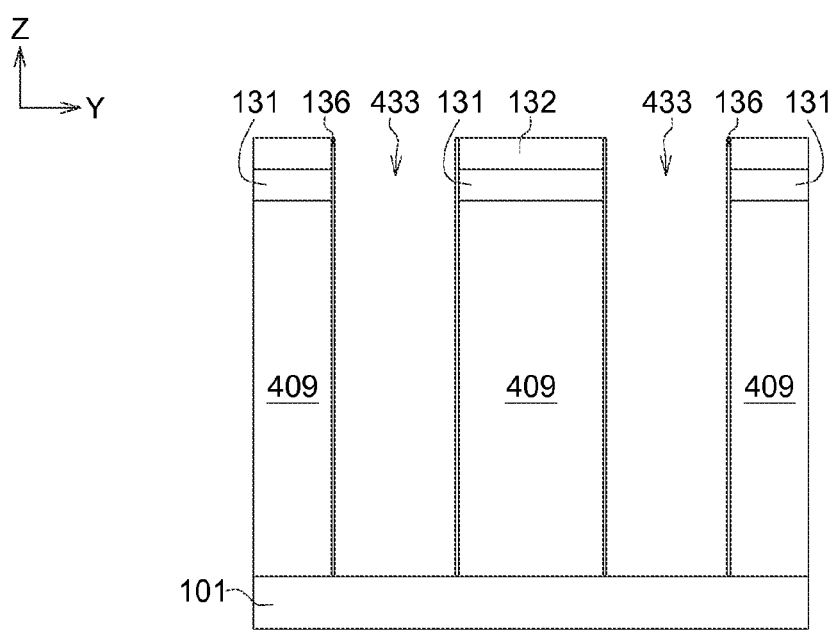
FIG. 4C3

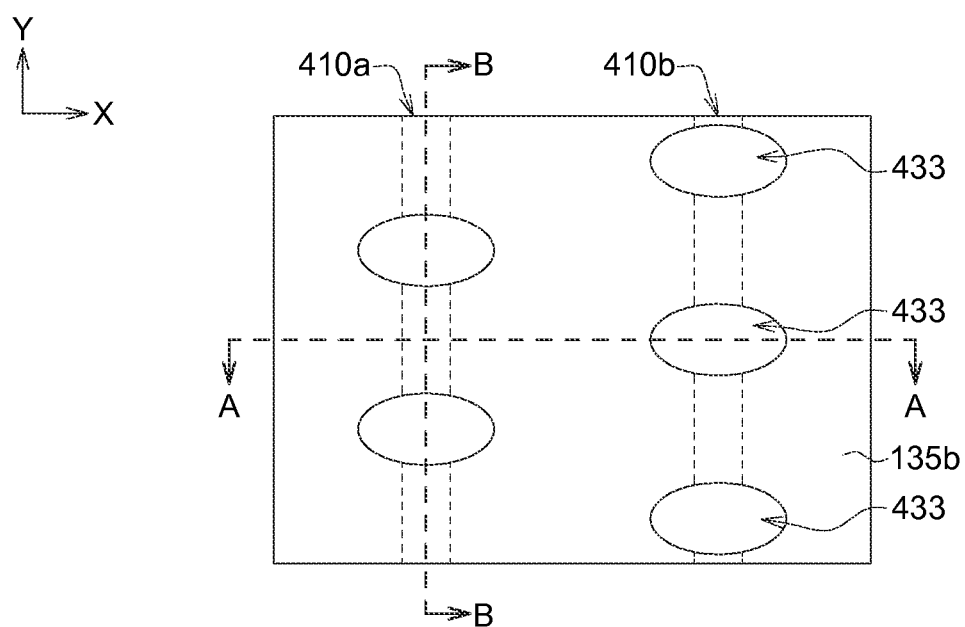
FIG. 4D1

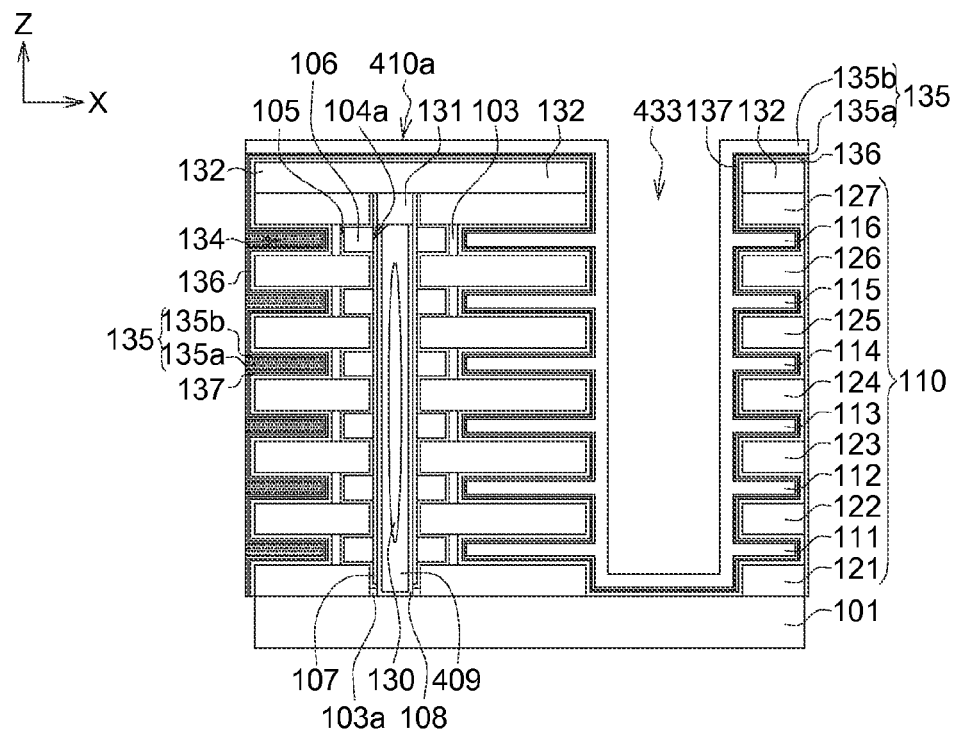
FIG. 4D2
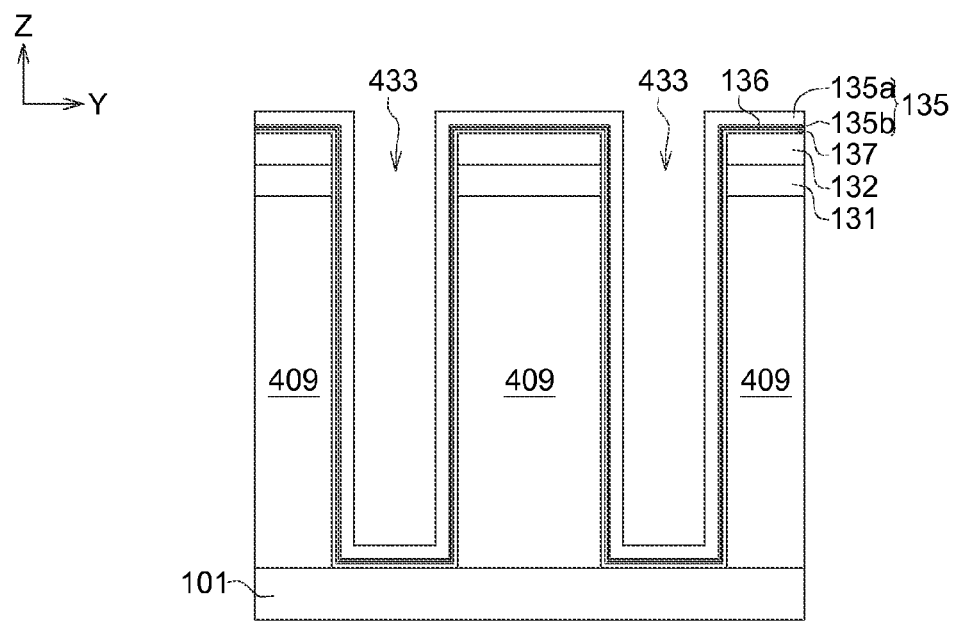
FIG. 4D3

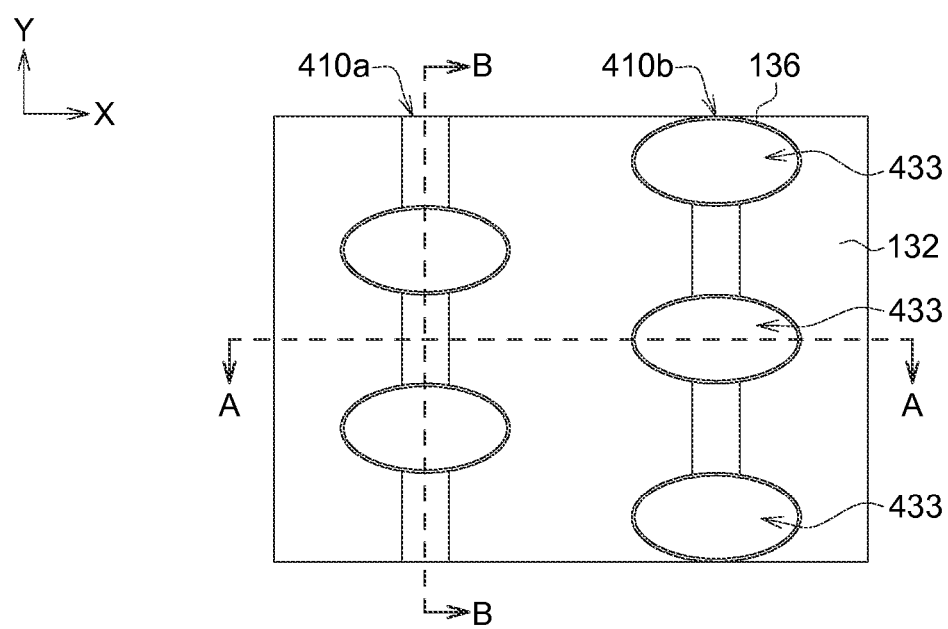
FIG. 4E1

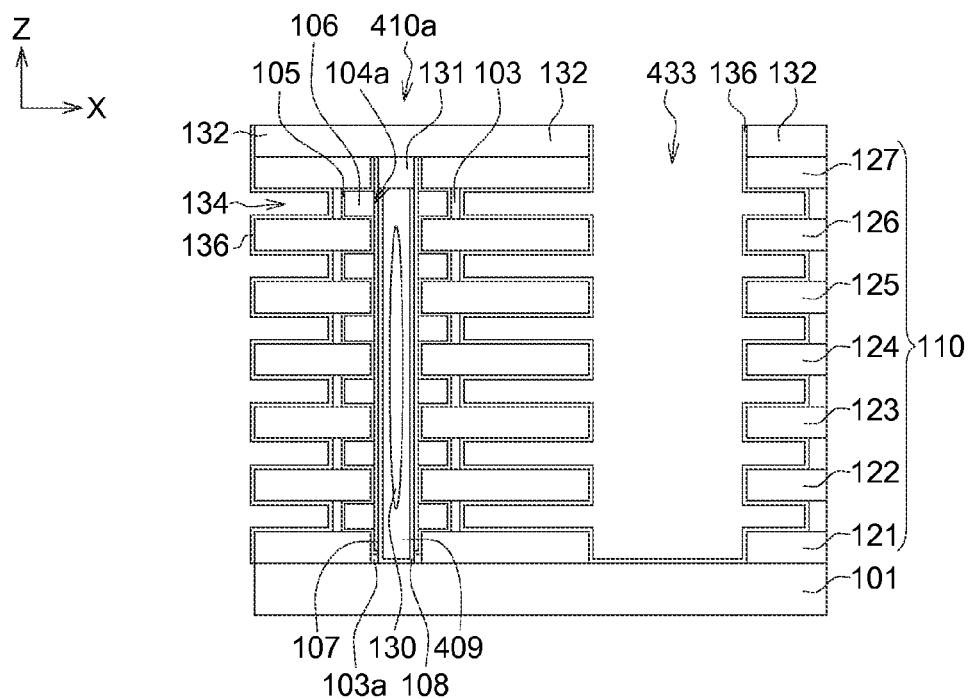
FIG. 4E2
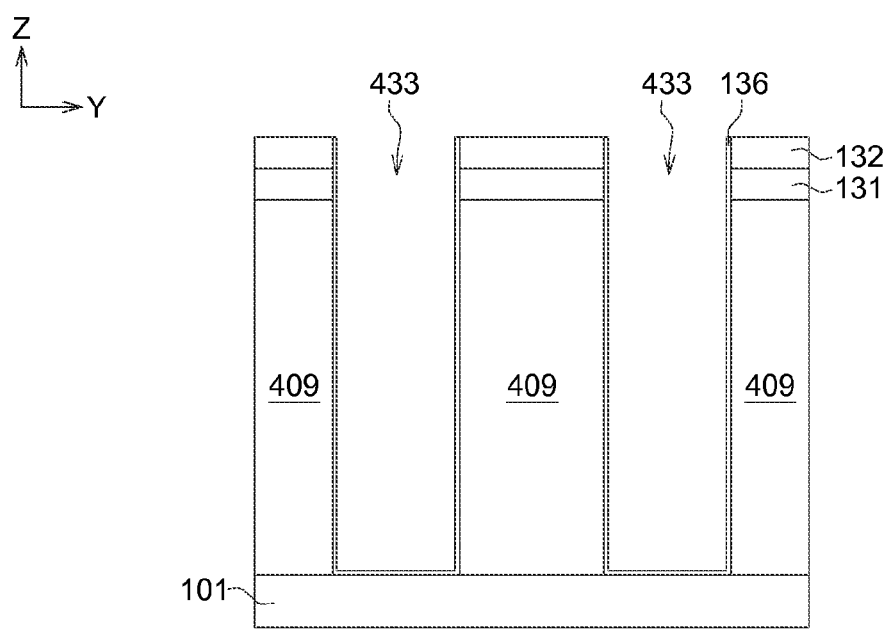
FIG. 4E3

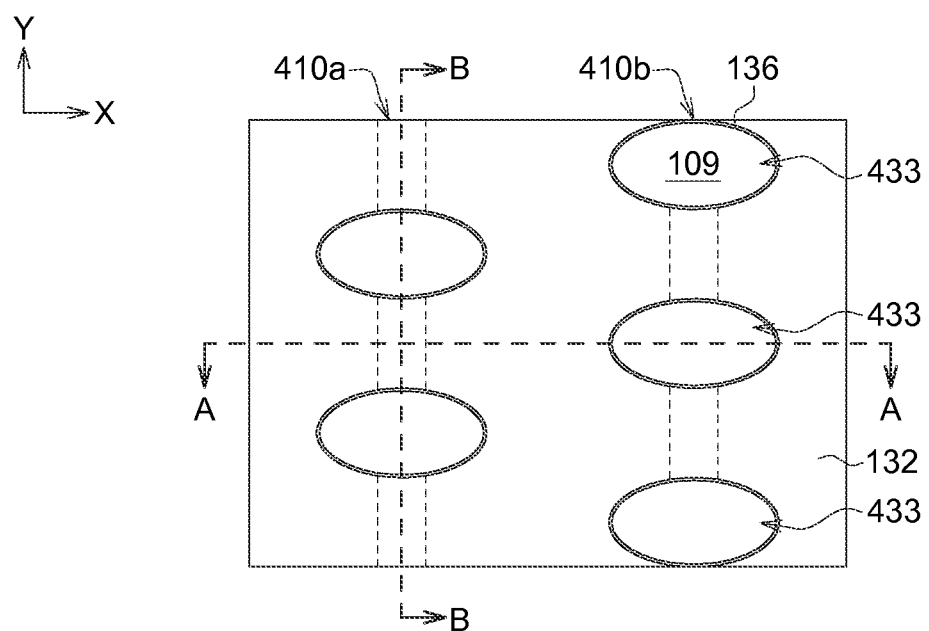
FIG. 4F1

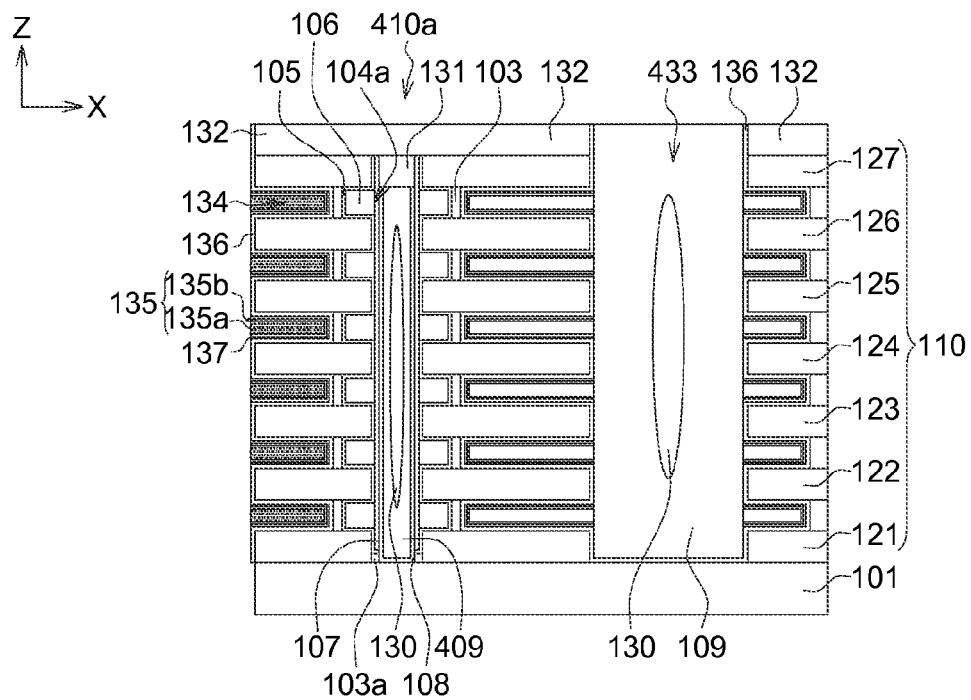
FIG. 4F2
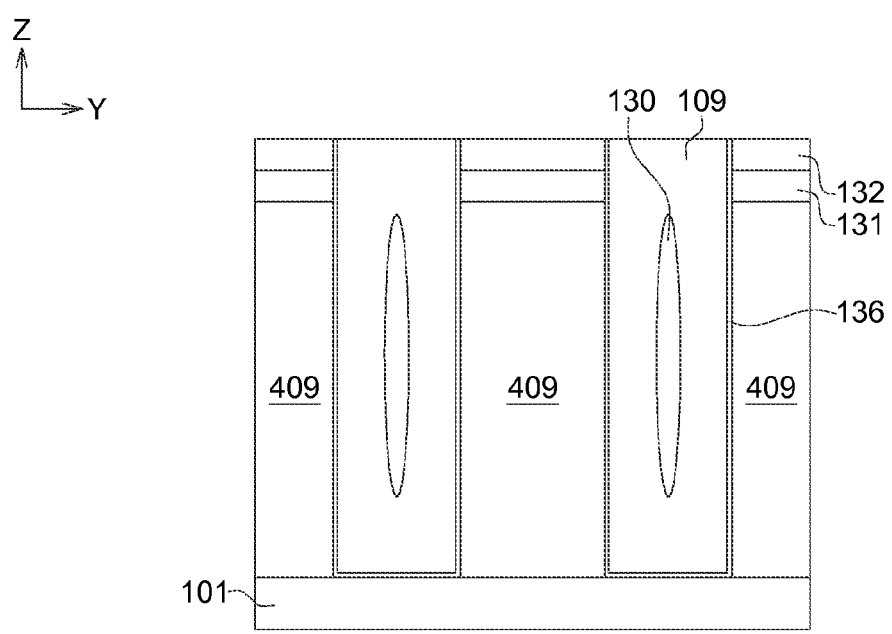
FIG. 4F3

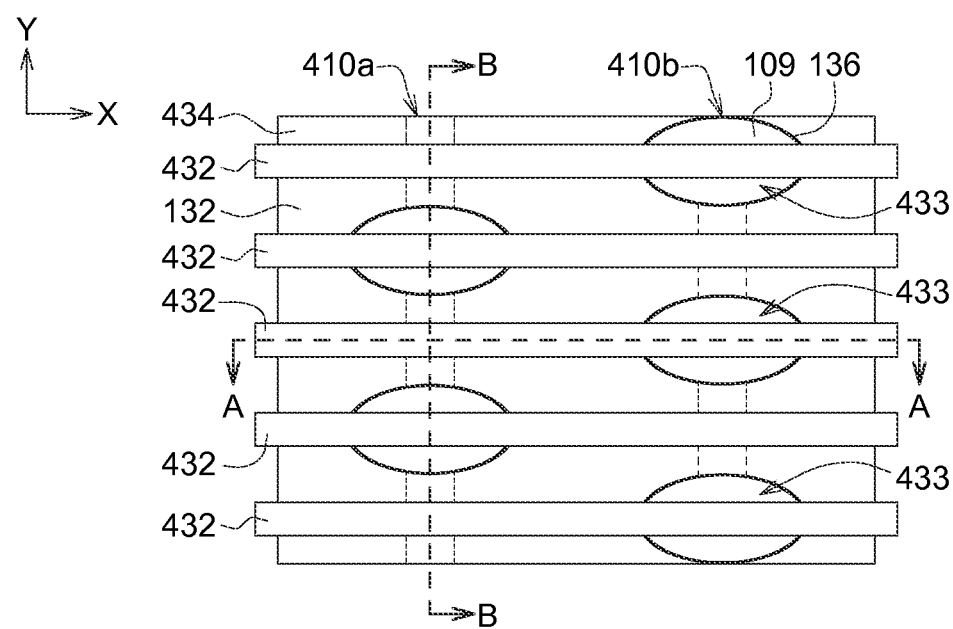
FIG. 4G1

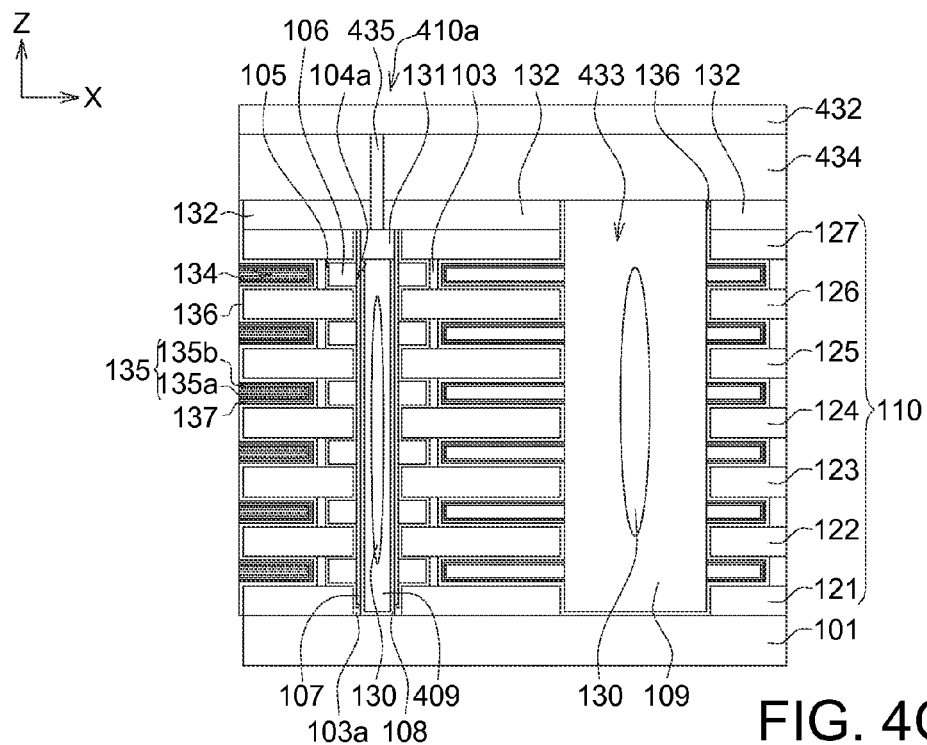
FIG. 4G2
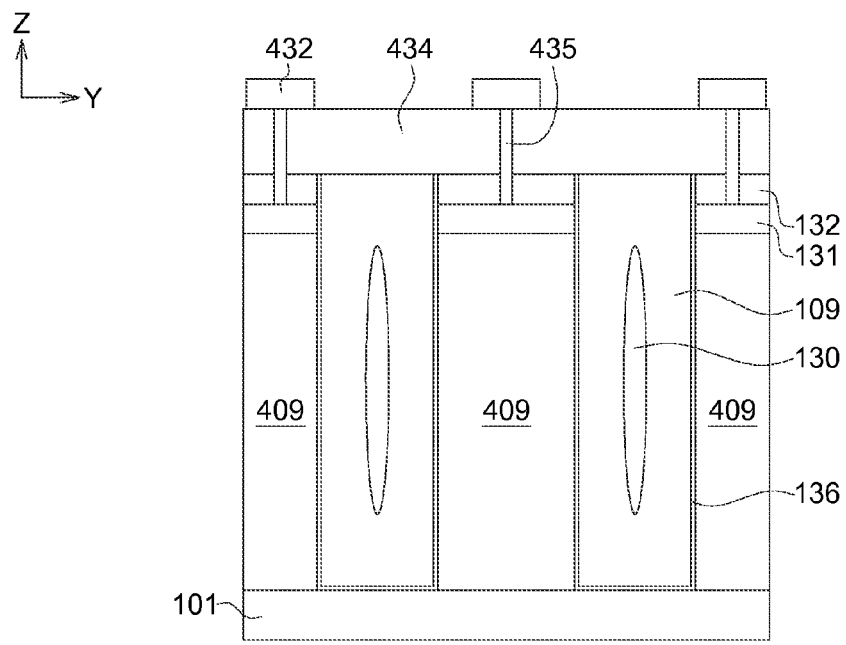
FIG. 4G3

MEMORY DEVICE AND METHOD FOR FABRICATING THE SAME

BACKGROUND

1. Technical Field

The disclosure of the present invention generally relates to a non-volatile memory (NVM) device and the method for fabricating the same, and more particularly to a vertical channel memory and the method for fabricating the same.

2. Description of the Related Art

An NVM device which is able to continually store information even when the supply of electricity is removed from the device containing the NVM cell has been widespreadly adopted by bulk solid state memory applications in the art. A flash memory is a typical NVM device having charge storage structure, such as floating gate or dielectric charge trapping layer, configured in memory cells. Data is stored in the memory cells by control the volume of charge trapped in the charge storage structure, and the data stored in the memory cells may be associated with a threshold voltage of the memory cells contributed by the volume of the trapped charge.

In comparison with a floating gate flash memory, a charge trapping flash memory, e.g. a flash memory having a silicon-oxide-nitric-oxide-silicon (SONOS) structure, the advantages of better data retention, lower operating voltage, thinner thickness and capable of being integrated in an embedded system. Currently, it is preferable to use memory cells with dielectric charge trapping layer as the major basic elements for configuring a vertical channel flash memory. However, the operation reliability of the vertical channel flash memory may be deteriorated by the influence of edge and corner effect due to the non-uniform distribution of the charge stored in the dielectric charge trapping layer during the program/erase operation. And these problems may get worse as the critical dimensions continue to shrink.

In addition, the method for fabricating a traditional vertical channel flash memory generally includes steps as follows: A multilayers stack configured by a plurality of insulating layers and a plurality of poly-silicon layers alternatively stacked with each other is firstly provided. At least one through hole or trench is then formed in the multilayers stack, and a SONOS memory layer and a channel layer are formed in sequence on the sidewalls of the through hole/trench, whereby a plurality of memory cells are defined at the intersection points formed by the SONOS memory layer, the channel layer and the poly-silicon layers.

However, because the insulating layers and the poly-silicon layers have very different intrinsic properties, for example the removing rate of the insulating layers may be rather different from that of the poly-silicon layers during the etching process to form the through hole/trench. The etching profile of the through hole/trench formed by the etching process performed on the multilayers stack may be tapered, and the etch depth may be limited by the taper profile. As a result, the process windows of the vertical channel flash memory can be reduced significantly and will lead to yield loss. The memory capacity of the vertical channel flash memory thus can be rather constrained.

Therefore, there is a need of providing a memory device and the method for fabricating the same to obviate the drawbacks encountered from the prior art.

SUMMARY

One aspect of the present invention is to provide a memory device, wherein the memory device includes a first insulating layer, a second insulating layer, an isolation layer, a floating gate electrode, a control gate electrode, a channel layer and a tunneling oxide layer. The second insulating layer is disposed adjacent to and substantially parallel with the first insulating layer to form an interlayer space there between. The isolation layer is disposed in the interlayer space to form a non-straight angle with the first insulating layer, and divides the interlayer space into a first recess and a second recess. The floating gate electrode is disposed in the first recess. The control gate electrode is disposed in the second recess. The channel layer is disposed on an opening surface of the first recess and forms a non-straight angle with the first insulating layer. The tunneling oxide layer is disposed between the channel layer and the floating gate electrode.

In accordance with another aspect of the present invention, a method for fabricating a memory device is provided, wherein the method includes steps as follows: Firstly, a multilayers stack having a plurality of insulating layers and a plurality of sacrificing layers alternatively stacked with each other is provided. Next, at least one first through opening passing through the multilayers stack is then formed to partially expose the insulating layers and the sacrificing layers. A pull-back etching process is then performed to remove portions of the sacrificing layers through the first through opening, whereby a plurality of first recesses are defined by the remaining sacrificing layers and the insulating layers. The remaining sacrificing layers are partially oxidized to form an insulation layer in each of the first recess. Subsequently, a plurality of floating gate electrodes are formed to respectively fill into the first recesses. A tunneling oxide layer is then formed to cover portions of the insulating layer and the floating gate electrodes exposed from the first through opening. A channel layer is formed on the tunneling oxide layer. Thereafter, at least one second through opening passing through the multilayers stacks is formed to partially expose the insulating layers and the remaining sacrificing layers. The remaining sacrificing layers is then removed to expose portions of the isolation layers, whereby a plurality of second recesses are defined by the insulating layers and the isolation layers. Subsequently, a plurality of control gates are formed to respectively fill in the second recesses.

In accordance with the aforementioned embodiments of the present invention, a memory device and method for fabricating the same are provided, wherein the method includes steps as follows: Firstly, a multilayers stack having a plurality of insulating layers and a plurality of sacrificing layers alternatively stacked with each other is provided. Next, at least one first through opening passing through the multilayers stack is then formed to partially expose the insulating layers and the sacrificing layers. Portions of the sacrificing layer are then removed to form a plurality of first recesses between each adjacent two insulating layers. Next, portions of the remaining sacrificing layer exposed from the first recesses are oxidized to form a plurality of isolation layers in the first recesses, wherein each of the isolation layers forms a non-straight angle with the first insulating layer. Thereafter, a plurality floating gate electrodes are formed to fill the recesses, and at least one tunneling oxide layer and at least one channel layer are formed in sequence on the sidewalls of the first through opening to cover the floating gate electrodes. Subsequently, at least one second through opening passing through the multilayers stack is formed; the remaining sacrificing layers are then removed through the second through opening to form a plurality of second recesses for exposing portions of the isolation layers; and a plurality of control gate electrodes are formed to fill the second recesses. As a result, each of the a floating gate electrode, the insulation layer and the control gate electrode formed between each two adjacent insulating layers can constitute a floating gate structure, and a plurality floating gate cells can be defined at the intersection points formed by the floating gate structure and the tunneling oxide layer covered with the channel layer.

By using the floating gate structure, the problems of reliability due to the influence of edge and corner effect can be alleviated, and the program/erase reliability of the memory device can be improved. Besides, since the isolation layers are formed by the oxidized sacrificing layers with thin film thickness, thus the gate couple ratio (GCR) of the memory device provided by the embodiments of the present invention can be improved significantly by using the thin film isolation layers as the inter-poly dielectric (IPD) layer of the floating gate structure. In addition, because the multilayers stack used to form the vertical channel memory device is made of alternatively stacked insulating layers and dielectric sacrificing layers which has similar removing rate during the process for forming the through opening. Better etching profile and deeper depth of the through opening can be obtained. Such that the resulted vertical channel memory device can have more memory capacity than that of the prior art charge trapping flash memory, e.g. the flash memory device using a SONOS structure. The process windows of the vertical channel memory device can be also enlarged. In other words, the memory device formed by the aforementioned method of the present invention can provide better performance without increasing the device size, in comparison with the prior art charge trapping flash memory using a SONOS structure.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4A1 is a top view illustrating the result after a protection layer is formed on the multilayers stack, in accordance with another embodiment of the present invention;

FIG. 4A2 is a cross-sectional view of the structure taken alone the line A-A depicted in FIG. 4A1;

FIG. 4B1 is a top view illustrating the result after a plurality of second through openings are formed on the structure depicted in FIG. 4A1;

FIG. 4B2 is a cross-sectional view of the structure taken alone the line A-A depicted in FIG. 4B1;

FIG. 4B3 is a cross-sectional view of the structure taken alone the line B-B depicted in FIG. 4B1;

FIG. 4C1 is a top view illustrating the result after the remaining sacrificing layers are removed from the structure depicted in FIG. 4B1;

FIG. 4C2 is a cross-sectional view of the structure taken alone the line A-A depicted in FIG. 4C1;

FIG. 4C3 is a cross-sectional view of the structure taken alone the line B-B depicted in FIG. 4C1;

FIG. 4D1 is a top view illustrating the result after a gate dielectric layer, a barrier layer and a metal layer are formed on the structure depicted in FIG. 4C1;

FIG. 4D2 is a cross-sectional view of the structure taken alone the line A-A depicted in FIG. 4D1;

FIG. 4D3 is a cross-sectional view of the structure taken alone the line B-B depicted in FIG. 4D1;

FIG. 4E1 is a top view illustrating the result after a metal pull-back etching process is performed on the structure depicted in FIG. 4D1;

FIG. 4E2 is a cross-sectional view of the structure taken alone the line A-A depicted in FIG. 4E1;

FIG. 4E3 is a cross-sectional view of the structure taken alone the line B-B depicted in FIG. 4E1;

FIG. 4F1 is a top view illustrating the result after an insulating material is filled in the first through openings depicted in FIG. 4E1;

FIG. 4F2 is a cross-sectional view of the structure taken alone the line A-A depicted in FIG. 4F1;

FIG. 4F3 is a cross-sectional view of the structure taken alone the line B-B depicted in FIG. 4F1;

FIG. 4G1 is a top view illustrating the result after a plurality of bit lines are formed on the structure depicted in FIG. F1;

FIG. 4G2 is a cross-sectional view of the structure taken alone the line A-A depicted in FIG. 4G1;

FIG. 4G3 is a cross-sectional view of the structure taken alone the line B-B depicted in FIG. 4G1.

DETAILED DESCRIPTION

Figure 1A:
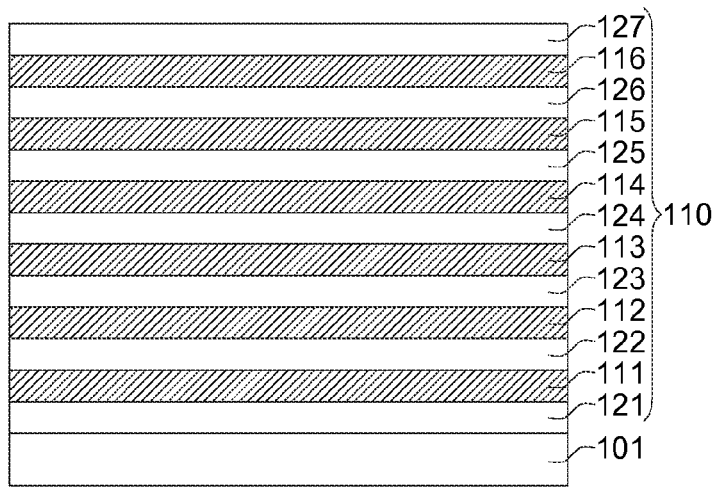
FIGS. 1A to 1L are cross-sectional views illustrating the processing structures for forming a memory device in accordance with one embodiment of the present invention.

The embodiments as illustrated below provide a memory device and the method for fabricating the same to solve the problems of reliability due to the influence of edge and corner effect. The present invention will now be described more specifically with reference to the following embodiments illustrating the structure and method for fabricating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

FIGS. 1A to 1L are cross-sectional views illustrating the processing structures for forming a memory device 100 in accordance with one embodiment of the present invention. In the present embodiment, the memory device 100 is a vertical channel flash memory device. The method for fabricating the memory device 100 includes steps as follows:

Firstly a multilayers stack 110 is provided. In some embodiments of the present invention, the multilayers stack 110 includes a plurality of insulating layers 121-127 and a plurality of sacrificing layers 111-116 formed on a substrate 101. The substrate 101 may be a semiconductor layer. For example, in some embodiments of the present invention, the substrate 101 is a p-type poly-silicon layer serving as a common source layer of the memory device 100. The insulating layers 121-127 and the sacrificing layers 111-116 are parallel to each other and alternatively stacked on the substrate 101 along the Z axle as shown in FIG. 1A. In the present embodiment, the insulating layer 121 and the insulating layer 127 respectively serve as the bottommost layer and the top-most layer of the multilayers stack 110 (see FIG. 1A).

The sacrificing layers 111-116 may be made of silicon-nitride compounds, such as silicon nitride (SiN), silicon oxynitride (SiON), silicon carbonitride (SiCN), or the arbitrary combinations thereof. In the present embodiment, the sacrificing layers 111-116 are made of SiN. The insulating layers 121-127 may be made of dielectric material, such as silicon oxide, SiN, SiON, silicate or the arbitrary combinations thereof. However, it should be appreciated that, in the embodiments of the present invention, the sacrificing layers 111-116 and the insulating layers 121-127 are made of different material. In the present embodiment, the insulating layers 121-127 are made of silicon oxide. In some embodiments of the present invention, the sacrificing layers 111-116 and the insulating layers 121-127 can be formed by low pressure chemical vapor deposition (LPCVD).

Figure 1B:
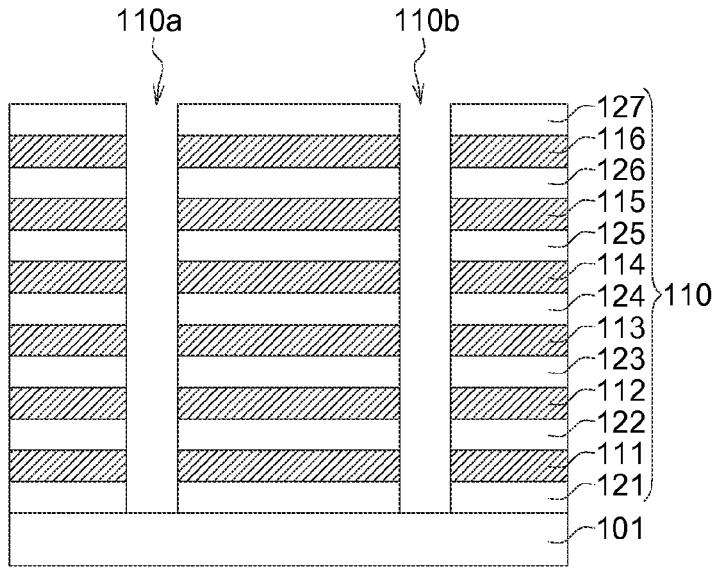
Figure 1C:
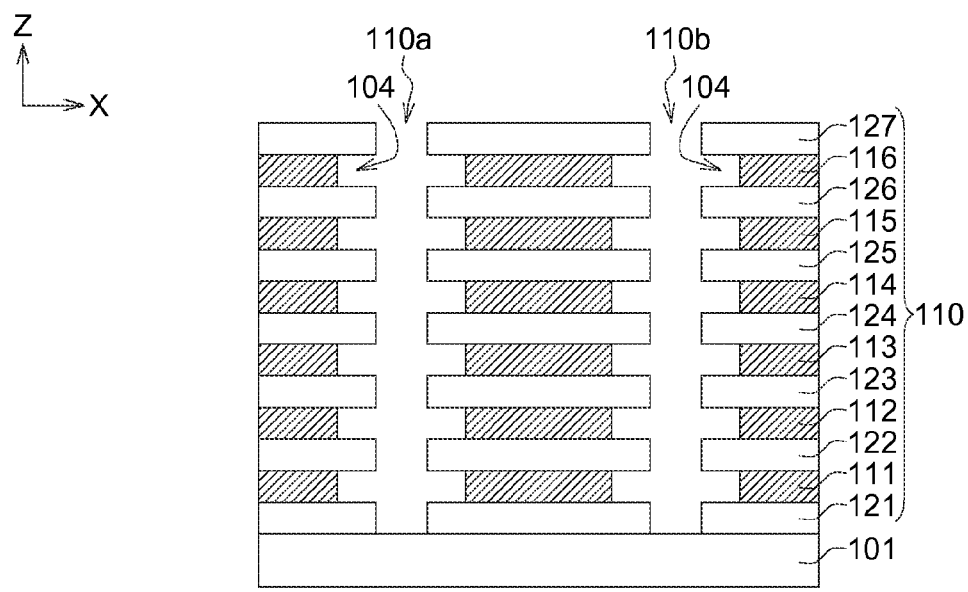

Next, an etching process is performed to form a plurality of through openings 110a and 110b passing through the multilayers stack 110, so as to expose a portion of the substrate 101 (see FIG. 1B). In some embodiments of the present invention, the etching process can be an anisotropic etching process, such as a reactive ion etching (RIE) process, performed on the multilayers stack 110 using a patterned hard mask layer as an etching mask. The through openings 110a and 110b may be a plurality of through holes (thereinafter referred to as through holes 110a and 110b) passing through the multilayers stack 110 along the Z axle and exposing a portion of the substrate 101. Because the sidewalls of the through holes 110a and 110b are constituted by the exposed portions of the sacrificing layers 111-116 and the insulating layers 121-127, thus portions of the sacrificing layers 111-116 and the insulating layers 121-127 can be exposed from the through holes 110a and 110b.

In addition, because the sacrificing layers 111-116 and the insulating layers 121-127 are both made of dielectric material, it is more likely to choose a suitable etchant having similar etching rate for removing both materials made of the sacrificing layers 111-116 and the insulating layers 121-127 to form the through holes 110a and 110b. As a result, a better etching profile and a deeper depth of the through holes 110a and 110b can be obtained, and the process windows of the subsequent process can be significantly enlarged.

A pull-back etching process is then performed to remove portions of the sacrificing layers 111-116 to form a plurality of first recesses 104 in an interlayer space defined by two adjacent insulating layers 121-127. In other words, each of the first recesses 104 is defined by two adjacent insulating layers 121-127 and the remaining sacrificing layer 111-116 disposed in the corresponding two adjacent insulating layers 121-127. In the present embodiment, the pull-back etching process is wet etching process using phosphoric acid ($H_3PO_4$) solution to remove portions of the sacrificing layers 111-116 embedded between the insulating layers 121-127 through the through holes 110a and 110b. Since each of the through holes 110a and 110b has a circular cross-sectional profile, thus each of the first recesses 104 that is formed by the wet etching process may be ring shaped hollow space (see FIG. 1D).

Figure 1D:
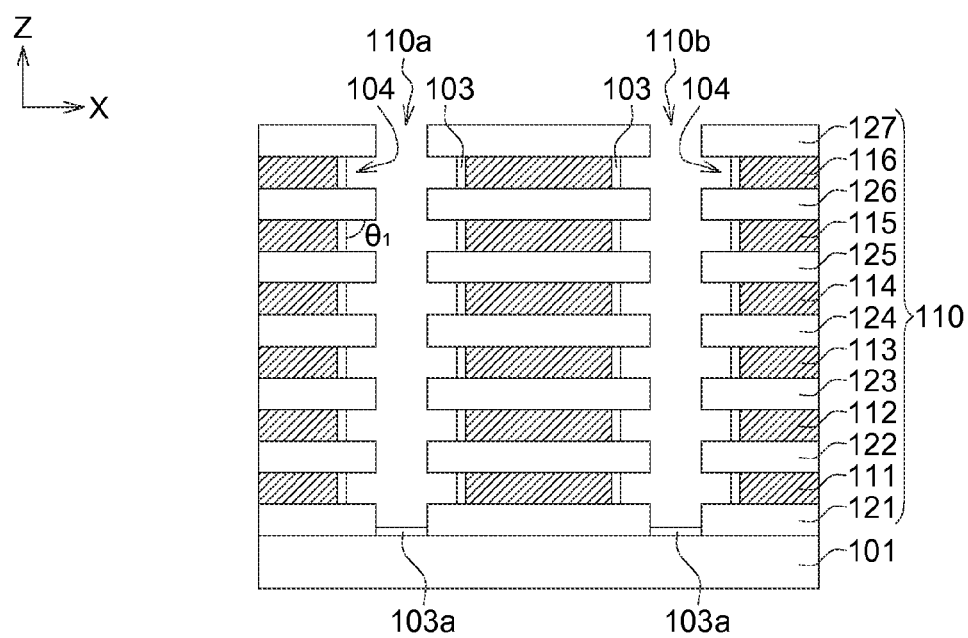
Figure 1E:
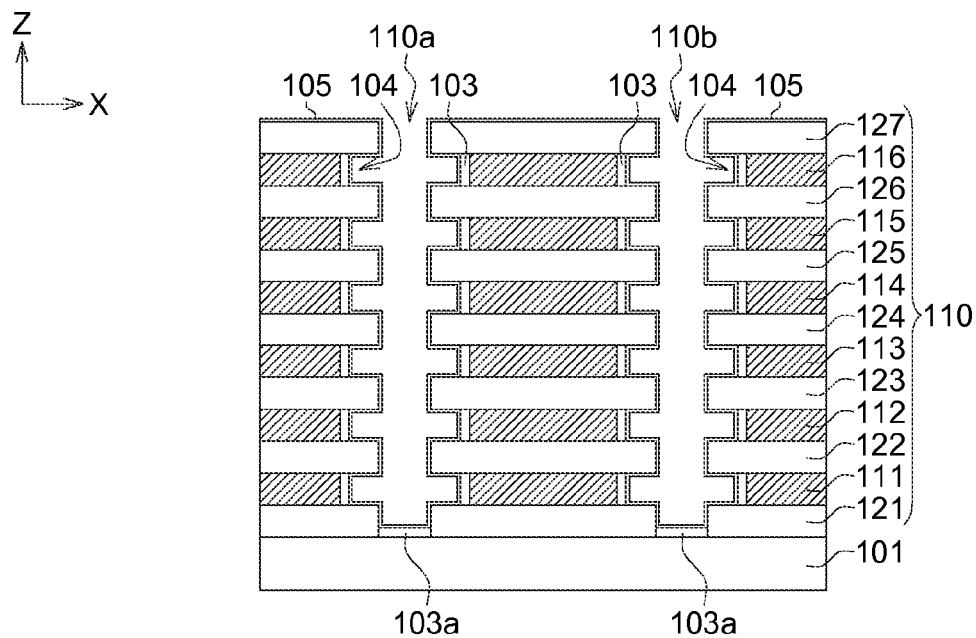

An oxidation process is then performed, by which the exposed portions of the remaining sacrificing layer 111-116 are oxidized to form a plurality of isolation layers 103 in the first recesses 104 (see FIG. 1D). In other words, the isolation layers 103 are formed on the sidewalls of the first recesses 104, and each of the isolation layers 103 can form a non-straight angle θ1, such as an angle of 90°, with the adjacent insulating layers 121-127. In the present embodiment, the oxidation process includes an in-situ steam generation (ISSG) oxidation process which can transform silicon nitride of the remaining sacrificing layer 111-116 into silicon oxide to form the isolation layers 103 having a ring shape.

In some embodiments of the present invention, the isolation layers 103 may both include silicon oxide and silicon nitride. Each of the solation layers 103 has a thickness ranging from 30 Å (angstrom) to 100 Å, and preferably is about 50 Å. Because the ration of the rate of oxide growth on a silicon nitride layer to the rate of oxide growth on a silicon layer is about 0.75:1, thus when the isolation layers 103 having a thickness of 70 Å growth on the remaining sacrificing layer 111-116 made of silicon nitride, there may be a silicon oxide layer 103a growth on the surface of the silicon substrate 101 having a thickness of 93 Å exposed from the through holes 110a and 110b.

Figure 1F:
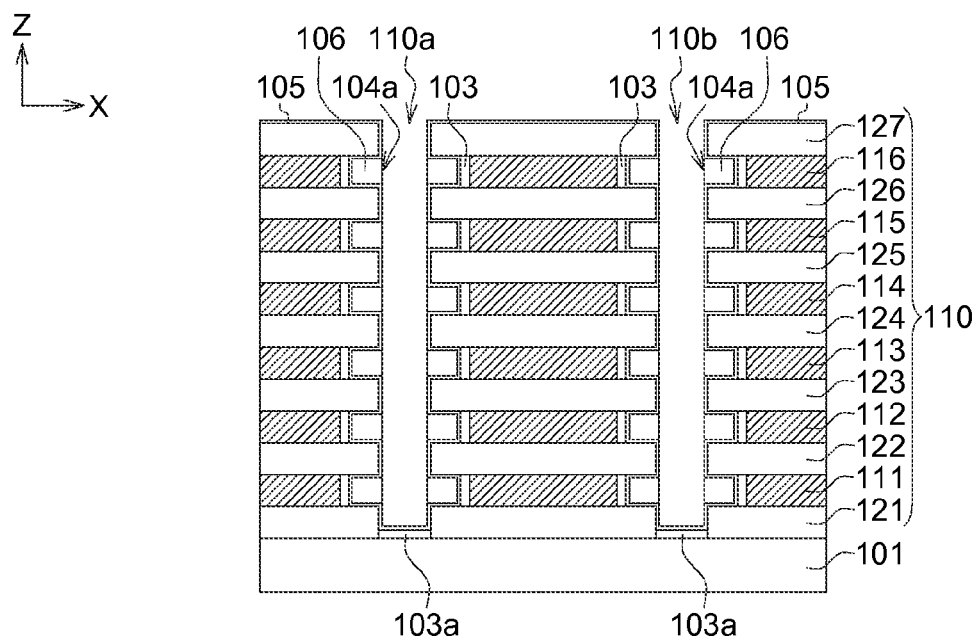
Figure 1G:
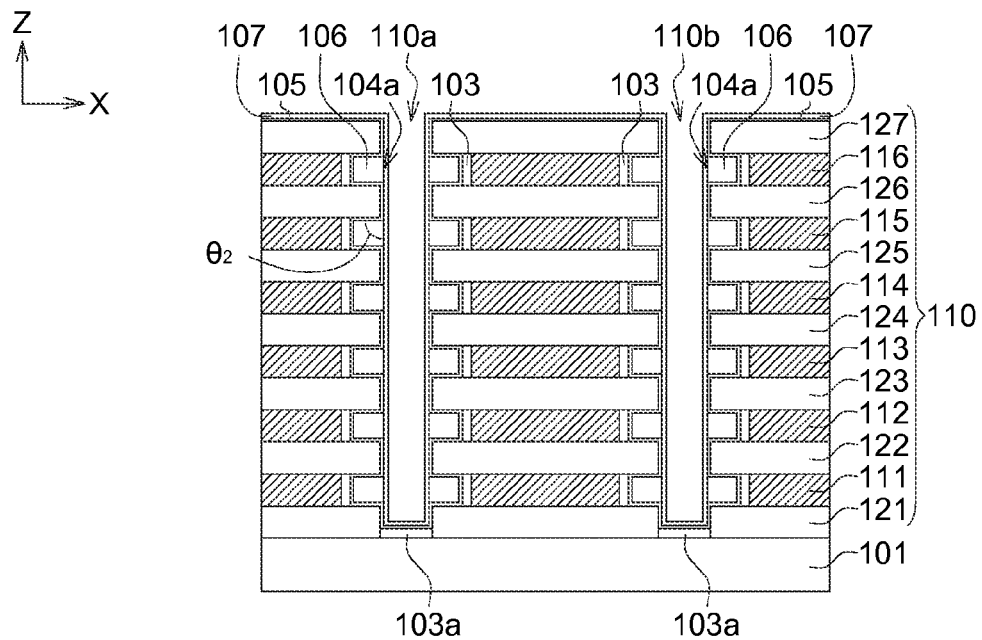

Subsequently, a plurality of floating gate electrodes 106 are formed to fill the first recesses 104 (see FIG. 1F). The forming of the floating gate electrodes 106 includes steps as follows: A deposition process, such as a LPCVD process, is firstly performed to form a conductive layer on the multilayers stack 110 and filling the through holes 110a and 110b as well as the first recesses 104. Another pull-back etching process is then performed to remove the portions of the conductive layer that are both disposed on the multilayers stack 110 and in the through holes 110a and 110b; and mere the portions of the conductive layer disposed in the first recesses are remained, whereby a plurality of ring shaped floating gate electrodes 106 are formed in the first recesses 104. In the present embodiment, the floating gate electrodes 106 may be made of poly-silicon, silicide or metal, such as aluminum (Al), copper (Cu), gold (Au), silver (Ag), Platinum (Pt) or the alloys thereof.

In order to remain the structure of the multilayers stack 110 having the first recesses 104 stable, prior to the forming of the floating gate electrodes 106, an optional nitridation process, such as a plasma nitridation process, can be performed to form a first lining layer 105 covering on the portions of the insulating layers 121-127 exposed from the through holes 110a and 110b as well as the first recesses 104 and covering on the portions of the isolation layers 103 exposed from the first recesses 104. In some embodiments of the present invention, the plasma nitridation process is performed to partially convert the silicon oxide involved in the portions of the insulating layers 121-127 and the isolation layers 103 into silicon nitride. Alternatively, the first lining layer 105 can be also formed by depositing silicon nitride with a thickness of 5 Å to 20 Å on the aforementioned portions of the insulating layers 121-127 and the isolation layers 103. However, the plasma nitridation process it is still preferred. In the present embodiment, the first lining layer 105 is a silicon nitride layer having a thickness substantially ranging from 5 Å to 20 Å, and preferably is about 10 Å. The portions for first lining layer 105 that are formed in the first recesses 104 are in contact with the two adjacent insulating layers 121-127 and the corresponding isolation layer 103 (see FIG. 1E).

After the floating gate electrodes 106 are formed, a tunneling oxide layer 107 may be formed by a deposition process to blanket over the multilayers stack 110 and the sidewalls and the bottom of the through holes 110a and 110b. In the present embodiment, the tunneling oxide layer 107 is comfomal with the portions of the insulating layers 121-127 and the floating gate electrodes 106 exposed from the through holes 110a and 110b. In other words, the portion of the tunneling oxide layer 107 blanketing over the sidewalls of the through holes 110a and 110b is disposed on the opening surface 104a of the first recesses 104 and forms a non-straight angle θ2, such as an angle of 90°, with the insulating layers 121-127 (see FIG. 1G). In some other embodiments of the present invention, the tunneling oxide layer 107 may be alternatively formed by an oxidation process to directly oxidize the portions of the floating gate electrodes 106 exposed from the first recesses 104, whereby the tunneling oxide layer 107 can be merely formed on the opening surface 104a of the first recesses 104.

Figure 1H:
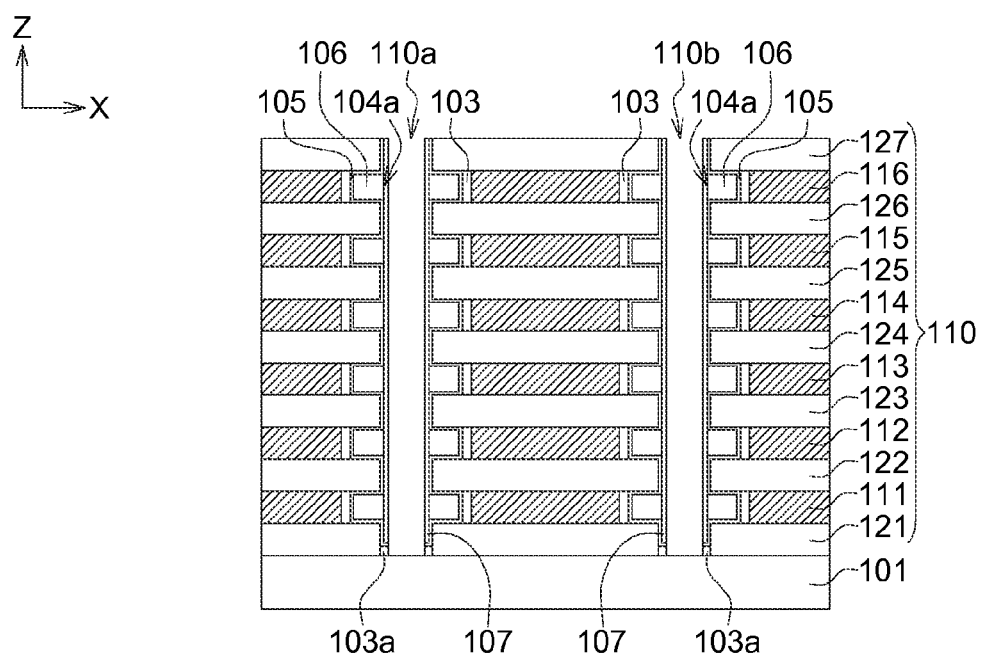
Figure 1I:
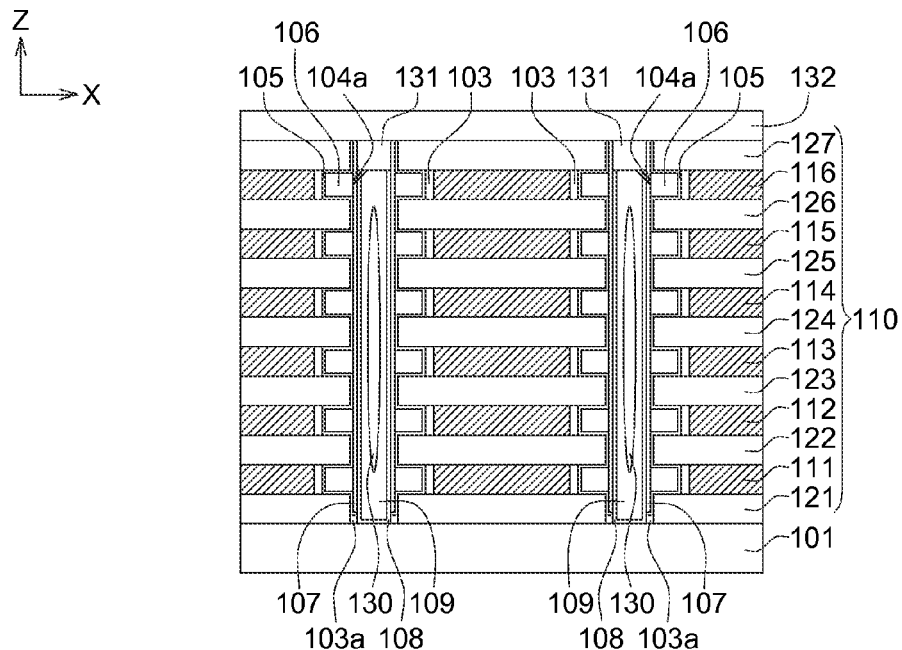

Next, the portion of the tunneling oxide layer 107 disposed on the bottom of the through holes 110a and 110b and a portion of the dielectric layer 103a disposed under the portion of the tunneling oxide layer 107 are removed by another etching process, whereby a portion of the substrate 101 is exposed from the through holes 110a and 110b again (see FIG. 1H).

A channel layer 108 is then formed to conformally covering on the tunneling oxide layer 107 and the portion of the substrate 101 exposed from the through holes 110a and 110b. In detail, a portion of the tunneling layer 107 may be disposed between the channel layer 108 and the floating gate electrodes 106, and the portion of the tunneling layer 107 can electrically isolate the channel layer 108 from the floating gate electrodes 106. After the forming of the channel layer 108, the through holes 110a and 110b is filled by a dielectric material 109, such as silicon dioxide ($SiO_2$), and at least one air gap 130 is formed in the filled through holes 110a and 110b. After the dielectric material 109 is etched back, a bond pad 131 may be formed on the dielectric material 109 to form an electrical contact with the channel layer 108, and a protection layer 132 is then provide to cover the bond pad 131 and the multilayers stack 110 (see FIG. 1I).

In some embodiments of the present invention, the channel layer 108 is made of semiconductor material, such as silicon, gallium (Ga), germanium (Ge), other doped or undoped semiconductor material, or the combinations thereof. In the present embodiment, the channel layer 108 is made of undoped poly-silicon. The protection layer 132 includes silicon oxide. Since the channel layer 108 is conformal with the tunneling oxide layer 107 which blankets over the sidewalls of the through holes 110a and 110b with a circular cross-sectional profile and the opening surface 104a of the first recesses 104, thus the tunneling oxide layer 107 and channel layer 108 are surrounded by the ring shaped isolation layer 103 and the floating gate electrodes 106. In addition, the channel layer 108 electrically contacts with the portion of the substrate 101 exposed from the through holes 110a and 110b.

Figure 1J:
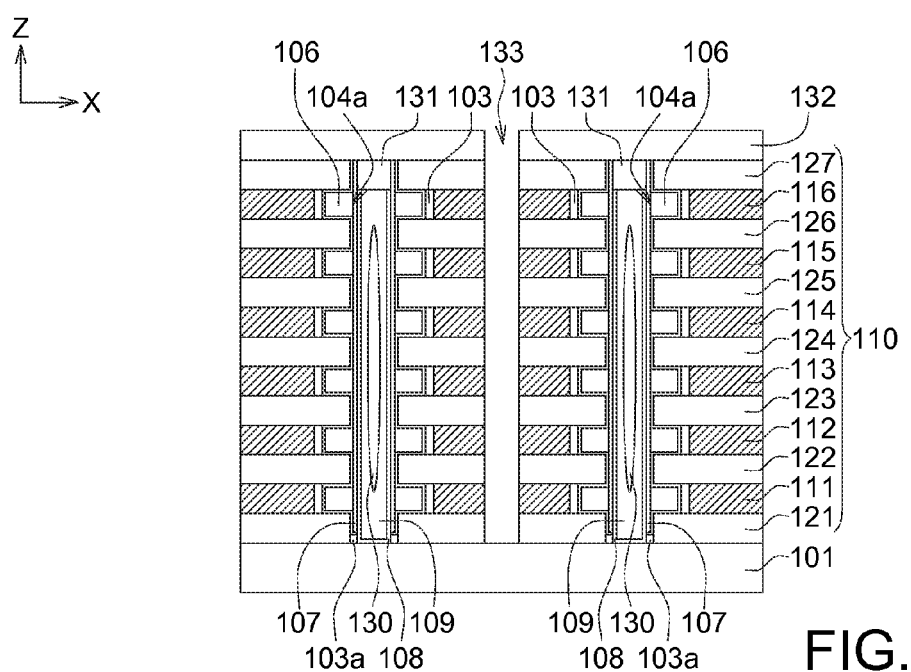
Figure 1K:
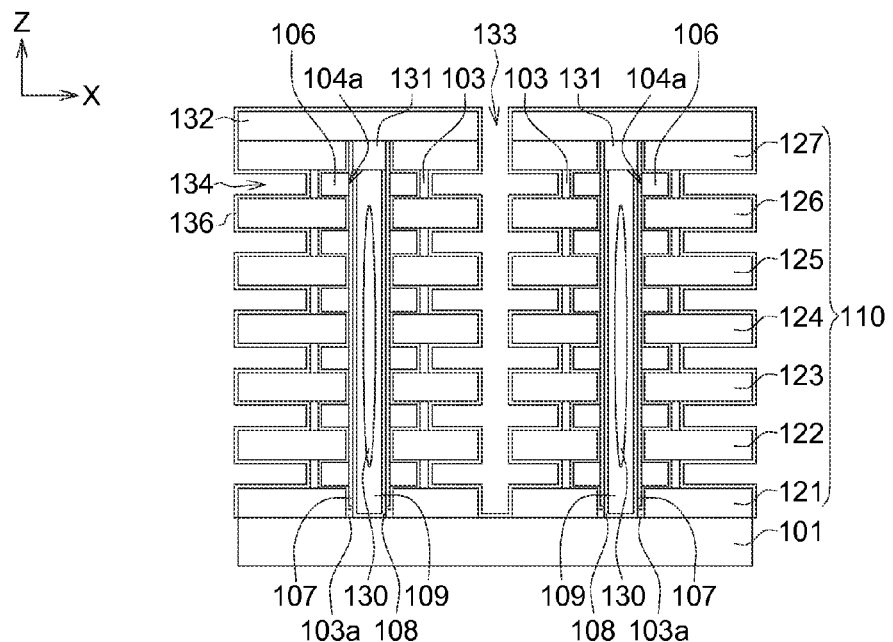
Figure 2:
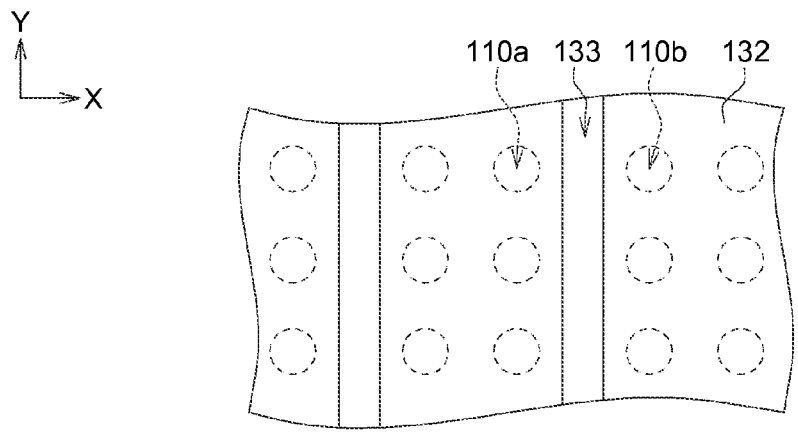
FIG. 2 is a top view illustrating a plurality of second through openings formed in the multilayers stack, in accordance one embodiment of the present invention.

Subsequently, another etching process is performed to form at least one second through opening 133 passing through the multilayers stack 110 to partially expose the insulating layers 121-127 and the sacrificing layers 111-116 (see FIG. 1J). In some embodiments of the present invention, the second through opening 133 extends down wards along the Z axle from the top surface of the multilayers stack 110, so as to expose a portion of the substrate 101, wherein the second through opening 133 can be a trench structure. For example, FIG. 2 is a top view illustrating a plurality of second through openings 133 formed in the multilayers stack 110, in accordance one embodiment of the present invention. In the present embodiment, the second through openings 133 are trenches (thereinafter referred to as the trenches 133) extending along the Y axle and disposed between the through hoes 110a and 110b. In other words, the trenches 133 do not overlap with the through hoes 110a and 110b. However, the trenches 133 are not limited in this respect. In some other embodiment, the profiles or arrangements of the trench 133 may be varied in accordance with different design of the memory device 100.

$H_3PO_4$ solution is then utilized again to remove the remaining sacrificing layers 111-116, whereby a plurality of second recesses 134 are formed respectively between each two adjacent insulating layers 121-127 to expose the portions of the isolation layers 103 departed from the floating gate electrode 106. In the present embodiment, each of the divides the isolation layers 103 is disposed in an interlayer space defined by each two adjacent two insulating layers 121-127 and divides the interlayer space into a first recces 104 and a second recess 134. In other words, each of the isolation layers 103 is disposed between one of the first recesses 104 and one of the second recesses 134, wherein one of the first recesses 104 and one of the second recesses 134 are disposed at the opposite sides of the corresponding isolation layer 103 (see FIG. 1K).

Thereafter, a plurality of control gates 135 are formed respectively filled each of the second recesses 134. In some embodiments of the present invention, the control gates 135 are made of poly-silicon, metal or other suitable conductive material. In the present embodiment, prior to the forming of the control gates 135, a gate dielectric layer 137 is formed on the portions of the isolation layers 103 exposed from the second recesses 134, wherein the process for forming the control gates 135 includes steps as follows:

Firstly, a gate dielectric layer 137 made of dielectric material with high dielectric constant (high-k), such as hafnium dioxide ($HfO_2$), aluminum oxide ($AlO_x$) or the combination thereof, is formed by a deposition process, such as a LCVD process, to blanket over the protection layer 132 and the portions of the insulating layer 121-127 and the isolation layers 103 exposed from the trench 133 and the second recesses 134. In the present embodiment, the gate dielectric layer 137 has a thickness substantially ranging from 1 nanometer (nm) to 20 nm, preferably is about 5 nm.

Another deposition process is then performed to form a barrier layer 135b, such as a titanium nitride (TiN), and a metal layer 135a in sequence on the gate dielectric layer 137, so as to fill the second recesses 134. Next, a metal pullback etching process is performed to remove portions of the metal layer 135a, the barrier layer 135b and the gate dielectric layer 137 disposed on the protection layer 132 and that filled in the trench 133, whereby merely the portions of the metal layer 135a, the barrier layer 135b and the gate dielectric layer 137 disposed in the second recesses 134 are remained. Subsequently, a dielectric layer 138 and a metal plug 139 are formed in the emptied trench 133, to make the metal plug 139 electrically contact to the substrate 101 and electrically insulated from the control gate electrodes 135 by the dielectric layer 138. After a series of back-end-of-line (BEOL) processes (not shown) are carried out, the forming of the memory 100 as shown in FIG. 1H can be accomplished (see FIG. 1L).

Similarly, in order to remain the structure of the multilayers stack 110 having the second recesses 134 stable, prior to the forming of the control gate electrodes 135, an optional nitridation process, such as a plasma nitridation process, can be performed to form a second lining layer 136 covering on the portions of the insulating layers 121-127 exposed from the trench 133 as well as the second recesses 134 and covering on the portions of the isolation layers 103 exposed from the second recesses 134. In some embodiments of the present invention, the plasma nitridation process is performed to partially convert the silicon oxide involved in the portions of the insulating layers 121-127 and the isolation layers 103 into silicon nitride. Alternatively, the second lining layer 136 can be also formed by depositing silicon nitride with a thickness of 5 Å to 20 Å on the aforementioned portions of the insulating layers 121-127 and the isolation layers 103. However, the plasma nitridation process it is still preferred. In the present embodiment, the second lining layer 136 is a silicon nitride layer having a thickness substantially ranging from 5 Å to 20 Å, and preferably is about 10 Å. The portions of the second lining layer 136 that are formed in the second recesses 134 are in contact with the two adjacent insulating layers 121-127 and the corresponding isolation layer 103 (see FIG. 1K).

Figure 1L:
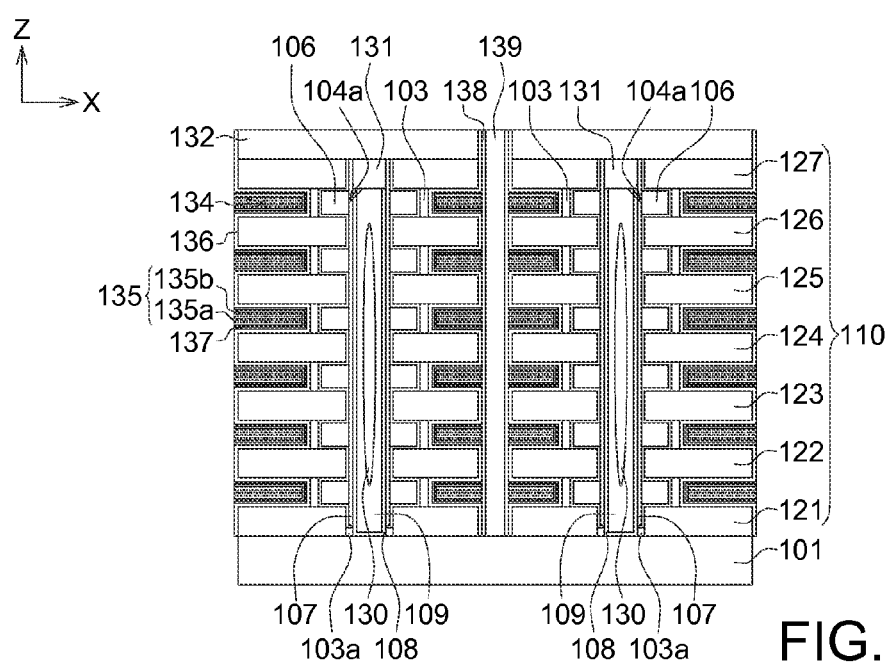
Figure 3:
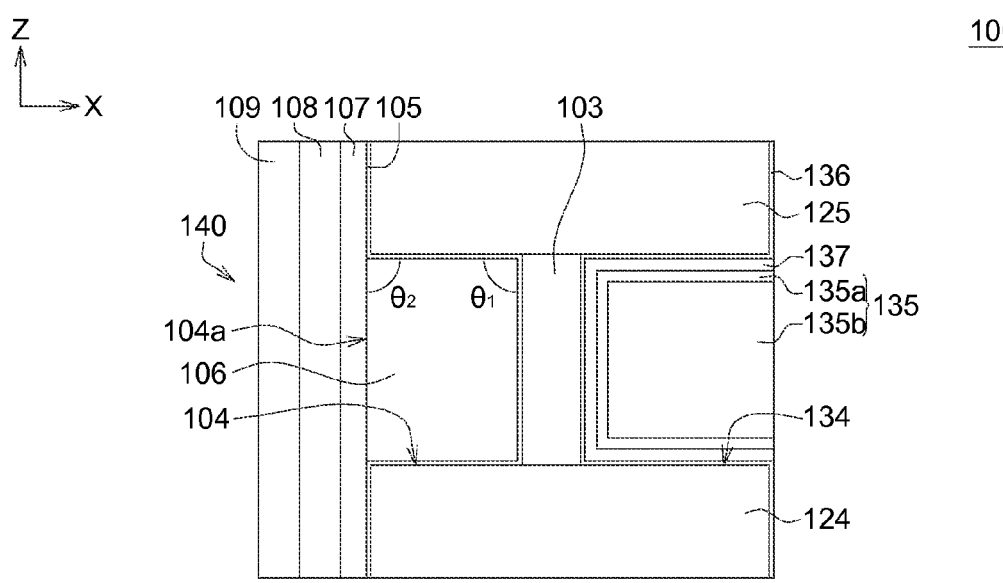
FIG. 3 is an enlarged cross-sectional view partially illustrating the memory device depicted in FIG. 1L.

FIG. 3 is an enlarged cross-sectional view partially illustrating the memory device 100 depicted in FIG. 1L. The memory device 100 includes a plurality of the insulating layer 121-127, a plurality of the isolation layer 103, a plurality of the floating gate electrodes 106, a plurality of the control gate electrodes 135, at least one tunneling oxide layer 107 and at least one channel layer 108. Each of the isolation layers 103 is disposed in an interlayer space defined by each two adjacent two insulating layers 121-127 and forms a non-straight angle θ1 with the insulating layers 121-127, so as to divides the interlayer space into a first recess 104 and a second recess 134. Each of the floating gate electrode 106 is disposed in one of the first recesses 104; and each of the control gate is disposed in one of the second recesses 134. The channel layer 108 and the tunneling oxide layer 107 are both disposed on the opening surface 104a of the first recesses 104 and forms a non-straight angle θ2 with the insulating layers 121-127. The tunneling oxide layer 107 is further disposed between the channel layer 108 and the floating gate electrodes 106, and electrically isolates the channel layer 108 from the floating gate electrodes 106. As a result, each of the a floating gate electrodes 106, the corresponding insulation layer 103 and the corresponding control gate electrode 134 formed between each two adjacent insulating layers 121-127 can constitute a floating gate structure, and a plurality floating gate cells 140 can be defined at the intersection points formed by the floating gate structure and the tunneling oxide layer 107 covered with the channel layer 108.

In addition, the memory device 100 further includes a first lining layer 105, a plurality of gate dielectric layer 137 and a second lining layer 136. The first lining layer 105 blankets over the sidewalls of the first recesses 104 and dispose between each of the floating gate electrodes 106 and the corresponding isolation layer 103. The second lining layer 136 blankets over the sidewalls of the second recesses 134 and dispose between each of the control gate electrodes 135 and the corresponding isolation layer 103. Each of the gate dielectric layer 137 is disposed in one of the second recesses 134 and dispose between the corresponding control gate electrode 135 and the second lining layer 136.

In the present embodiment, the IPD of the floating gate structure constituted by the first lining layer 105, the gate dielectric layer 137, the second lining layer 136 and the isolation layer 103 has a thickness about 12 nm, and the GCR measured between the corresponding control gate electrode 135 and the floating gate electrode 106 substantially ranges from 0.54 to 6. It can be indicated that the memory device 100 can provide a performance equivalent to or better than that provided by the traditional flash memory having a SONOS structure. In addition, by using the floating gate structure, the problems of reliability due to the influence of edge and corner effect can be alleviated, and the program/erase reliability of the memory device 100 can be improved.

Of note that, in the aforementioned embodiments, although the firs through openings are implemented as a plurality if through holes 110a and 110b; and the second through openings are implemented as a plurality of trenches. The shape and arrangement of the first through openings and the second through openings may be not limited in this respect. FIG. 4A1 is a top view illustrating the result after a protection layer 132 is formed on the multilayers stack 110, in accordance with another embodiment of the present invention. FIG. 4A2 is a cross-sectional view of the structure taken alone the line A-A depicted in FIG. 4A1.

The structure illustrated in FIGS. 4A1 and 4A2 is similar to that illustrated in FIGS. 1J and 2, except that the shape and arrangement of the first through openings and the second through openings are varied. In the present embodiment, the firs through openings 410a and 410b are implemented as a plurality of trenches rather than a plurality of through holes as shown in FIG. 2; and the second through openings 433 are implemented as a plurality of through holes rather than a plurality of trenches as shown in FIG. 2. Since the material and process for fabricating the memory device 400 are identical to that of the memory device 100 except the shape and arrangement of the first through openings and the second through openings, the identical processing steps prior to the forming of protection layer 132 are not redundantly repeated, and the identical elements of the embodiments are designated with the same reference numerals.

In the present embodiment the first through openings 410a and 410b (thereinafter referred to as trenches 410a and 410b) are trenches laterally extending along the Y axle and vertically extending along the Z axle in a manner of passing through the multilayers stack 110. In addition, unlike the dielectric material 109 used to fill the through holes 110a and 110b as shown in FIG. 1J, the dielectric material 409 used to fill the trenches 410a and 410b is a spin-on-dielectric (SOD) material, by which the trenches 410a and 410b can be thoroughly filled without occurring any void.

After the protection layer 132 is formed, an etching process is performed to form a plurality of second through opening 433 passing through the multilayers stack 110 to partially expose the insulating layers 121-127 and the sacrificing layers 111-116. FIG. 4B1 is a top view illustrating the result after a plurality of second through openings 433 are formed on the structure depicted in FIG. 4A1. FIG. 4B2 is a cross-sectional view of the structure taken alone the line A-A depicted in FIG. 4B1. FIG. 4B3 is a cross-sectional view of the structure taken alone the line B-B depicted in FIG. 4B1.

In the present embodiment, the second through opening 433 (therein after referred to as through holes 433) are through holes having a circular cross-sectional profile and vertically passing through the multilayers stack 110 in a manner of exposing a portion of the substrate 101 therefrom. The through holes 433 are not overlapped with the adjacent first through opening (the trenches 410a and 410b), instead of alternatively arranged with the adjacent trenches 410a and 410*b*. However, in some other embodiment, the profiles or arrangements of the trench 133 are not limited in this respect, and may be varied in accordance with different design of the memory device 400.

$H_3PO_4$ solution is then utilized again to remove the remaining sacrificing layers 111-116, whereby a plurality of second recesses 434 are respectively formed between each two adjacent insulating layers 121-127 to expose the portions of the isolation layers 103 departed from the floating gate electrode 106. FIG. 4C1 is a top view illustrating the result after the remaining sacrificing layers 111-116 are removed from the structure depicted in FIG. 4B1. FIG. 4C2 is a cross-sectional view of the structure taken alone the line A-A depicted in FIG. 4C1. FIG. 4C3 is a cross-sectional view of the structure taken alone the line B-B depicted in FIG. 4C1.

FIG. 4D1 is a top view illustrating the result after a gate dielectric layer 137, a barrier layer 155*b* and a metal layer 135*a* are formed on the structure depicted in FIG. 4C1. FIG. 4D2 is a cross-sectional view of the structure taken alone the line A-A depicted in FIG. 4D1. FIG. 4D3 is a cross-sectional view of the structure taken alone the line B-B depicted in FIG. 4D1. The process for forming the metal layer 135*a*, the barrier layer 135*b* and the gate dielectric layer 137 includes steps as follows: Firstly, a gate dielectric layer 137 made of high-k dielectric material, such as $HfO_2$, $AlO_x$ or the combination thereof, is formed by a deposition process, such as a LCVD process, to blanket over the protection layer 132 and the portions of the insulating layer 121-127 and the isolation layers 103 exposed from the trench 133 and the second recesses 134. Another deposition process is then performed to form a barrier layer 135*b*, such as a titanium nitride (TiN), and a metal layer 135*a* in sequence on the gate dielectric layer 137, so as to fill the second recesses 134.

FIG. 4E1 is a top view illustrating the result after a metal pull-back etching process is performed on the structure depicted in FIG. 4D1. FIG. 4E2 is a cross-sectional view of the structure taken alone the line A-A depicted in FIG. 4E1. FIG. 4E3 is a cross-sectional view of the structure taken alone the line B-B depicted in FIG. 4E1. In the present embodiment, the metal pullback etching process is used to remove portions of the metal layer 135*a*, the barrier layer 135*b* and the gate dielectric layer 137 disposed on the protection layer 132 and that filled in the trench 433, whereby merely the portions of the metal layer 135*a*, the barrier layer 135*b* and the gate dielectric layer 137 disposed in the second recesses 134 are remained, and the remained portions of the metal layer 135*a*, the barrier layer 135*b* constitute the control gates 135 of the memory device 400.

FIG. 4F1 is a top view illustrating the result after an insulating material 109 is filled in the second through openings (through holes 433) depicted in FIG. 4E1. FIG. 4F2 is a cross-sectional view of the structure taken alone the line A-A depicted in FIG. 4F1. FIG. 4F3 is a cross-sectional view of the structure taken alone the line B-B depicted in FIG. 4F1. In the present embodiment, the forming of the insulating material 109 is implemented by performing a deposition process, such as a LPCVD process, to fill the through holes 433 with dielectric material, such as silicon oxide, having a plurality of voids formed therein.

FIG. 4G1 is a top view illustrating the result after a plurality of bit lines 432 are formed on the structure depicted in FIG. F1. FIG. 4G2 is a cross-sectional view of the structure taken alone the line A-A depicted in FIG. 4G1. FIG. 4G3 is a cross-sectional view of the structure taken alone the line B-B depicted in FIG. 4G1. In the present embodiment, the forming of the bit lines 432 includes steps as follows: An inter-layer dielectric (ILD) 434 is firstly formed on the protection layer 132. A plurality of bit lines 432 electrically connected to the bond pad 131 with an interconnection via 435 are formed on a patterned metal layer formed on the ILD 434 by a metal patterning process. After a series of BEOL processes (not shown) are carried out, the forming of the memory device 400 can be accomplished.

Figure 5A:
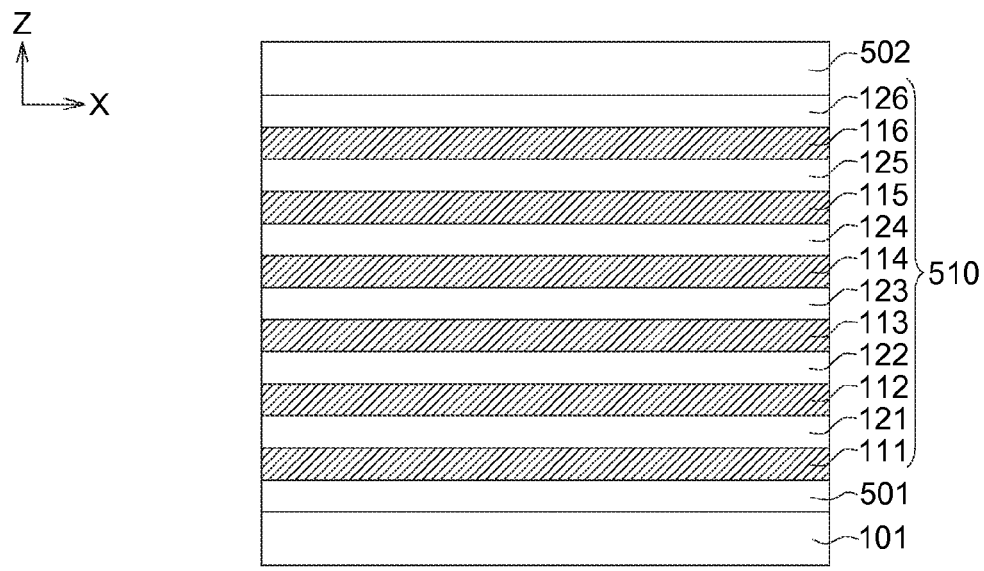
FIGS. 5A to 5L are cross-sectional views illustrating the processing structures for forming a memory device in accordance with yet another embodiment of the present invention.

FIGS. 5A to 5L are cross-sectional views illustrating the processing structures for forming a memory device 500 in accordance with yet another embodiment of the present invention. In the present embodiment, the memory device 500 is a vertical channel flash memory device. The method for fabricating the memory device 100 includes steps as follows:

Firstly a multilayers stack 510 is provided. In some embodiments of the present invention, the multilayers stack 510 includes a bottom insulating layer 501, a plurality of insulating layers 121-126, a plurality of sacrificing layers 111-116 and a semiconductor capping layer 502 formed on a substrate 101. In the present embodiment, the bottom insulating layer 501 can be a silicon oxide layer formed on the substrate 101. The insulating layers 121-126 and the sacrificing layers 111-116 are parallel to each other and alternatively stacked on the bottom insulating layer 501 along the Z axle as shown in FIG. 5A. The semiconductor capping layer 502 is disposed on the top-most layer of the multilayers stack 510, i.e. the sacrificing layer 116.

Figure 5B:
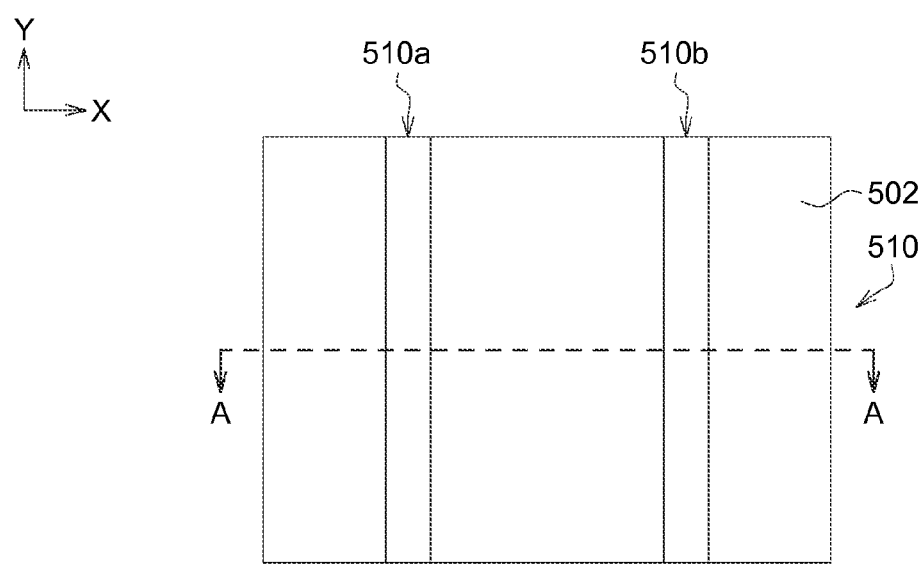
Figure 5C:
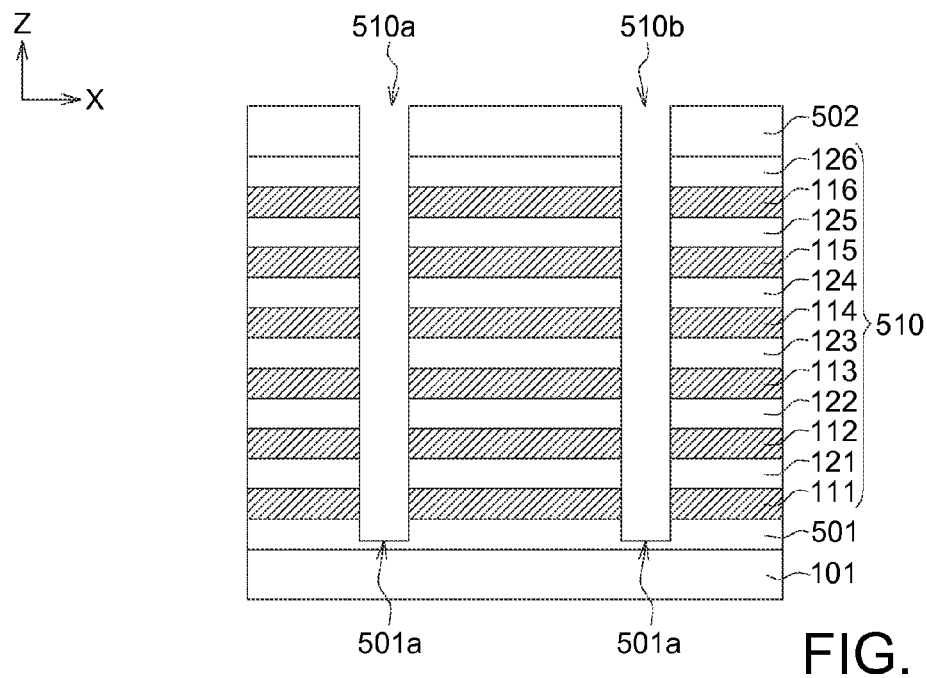
Figure 5D:
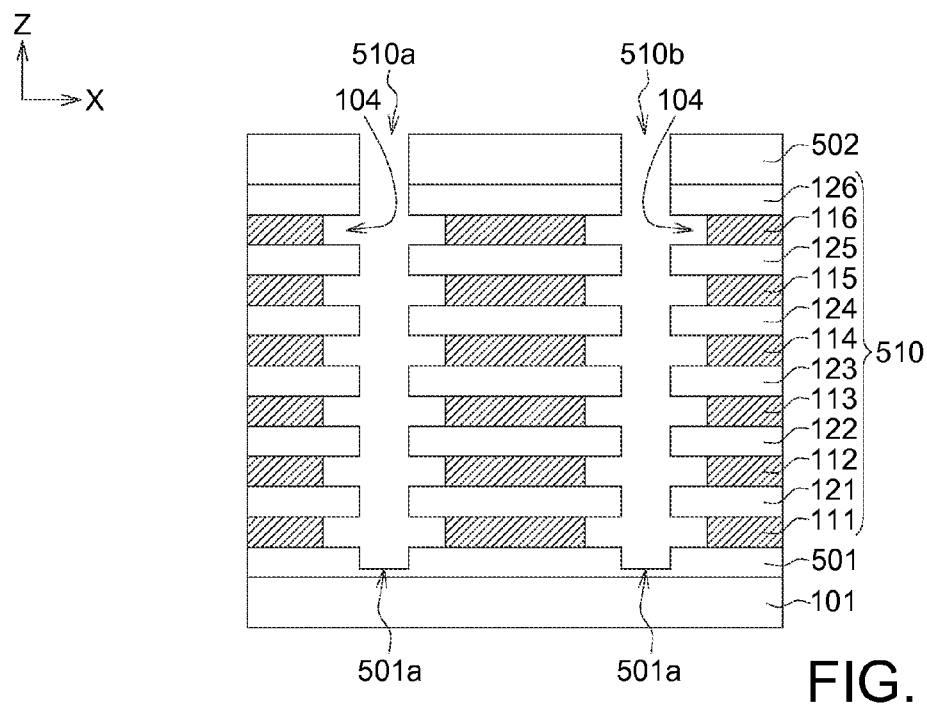

Next, an etching process is performed to form a plurality of first through openings 510*a* and 510*b* passing through the multilayers stack 510, so as to expose a portion of the bottom insulating layer 501. FIG. 5B is a top view illustrating the result after a plurality of through openings 510*a* and 510*b* formed on the multilayers stack 510 depicted in FIG. 5A, in accordance with one embodiment of the present invention. FIG. 5C is a cross-sectional view of the structure taken alone the line A-A depicted in FIG. 5B. In the present embodiment, the etching process can be an anisotropic etching process, such RIE process, performed on the multilayers stack 510 using a patterned hard mask layer as an etching mask. The first through openings 510*a* and 510*b* may be a plurality of trenches (thereinafter referred to as trenches 510*a* and 510*b*) passing through the multilayers stack 510 along the Z axle and exposing a portion of the bottom insulating layer 501.

Because the sidewalls of the trenches 510*a* and 510*b* are constituted by the exposed portions of the sacrificing layers 111-116 and the insulating layers 121-126, thus portions of the sacrificing layers 111-116 and the insulating layers 121-126 can be exposed from the trenches 510*a* and 510*b*. In the present embodiment, the trenches 510*a* and 510*b* may extend into the bottom insulating layer 501 to form a recess 501*a* having a U-shaped cross-sectional profile.

A pull-back etching process is then performed to remove portions of the sacrificing layers 111-116 to form a plurality of first recesses 104 in an interlayer space defined by two adjacent insulating layers 121-127. In other words, each of the first recesses 104 is defined by two adjacent insulating layers 121-127 and the remaining sacrificing layer 111-116 disposed in the corresponding two adjacent insulating layers 121-127. Since each of the through holes 110*a* and 110*b* has a circular cross-sectional profile, thus each of the first recesses 104 that is formed by the wet etching process may be ring shaped hollow space (see FIG. 5D).

An oxidation process is then performed, by which the exposed portions of the semiconductor capping layer 502 can be oxidized to form a silicon oxide layer 503; and the exposed portions of the remaining sacrificing layer 111-116 are oxidized to form a plurality of isolation layers 103 in the first recesses 104. In the present embodiment, the silicon oxide layer 503 is formed on the top surface of the semiconductor capping layer 502 and the vertical surface exposed from the trenches 510a and 510b. The isolation layers 103 are formed on the sidewalls of the first recesses 104, and each of the isolation layers 103 can form a non-straight angle θ1, such as an angle of 90°, with the adjacent insulating layers 121-126. The oxidation process includes an ISSG oxidation process which can respectively transform silicon nitride of the remaining sacrificing layer 111-116 and the poly-silicon of the semiconductor capping layer 502 into silicon oxide to form the isolation layers 103 and the silicon oxide layer 503 (see FIG. 5E).

Subsequently, a plurality of floating gate electrodes 106 are formed to fill the first recesses 104 (see FIG. 5F). The forming of the floating gate electrodes 106 includes steps as follows: A deposition process, such as a LPCVD process, is firstly performed to form a conductive layer on the multilayers stack 510 and filling the trenches 510a and 510b as well as the first recesses 104. Another pull-back etching process is then performed to remove the portions of the conductive layer that are both disposed on the multilayers stack 510 and in the trenches 510a and 510b; and mere the portions of the conductive layer disposed in the first recesses are remained, whereby a plurality of floating gate electrodes 106 are formed in the first recesses 104. In the present embodiment, the floating gate electrodes 106 may be made of poly-silicon, silicide or metal, such as Al, Cu, Au, Ag, Pt or the alloys thereof.

Figure 5E:
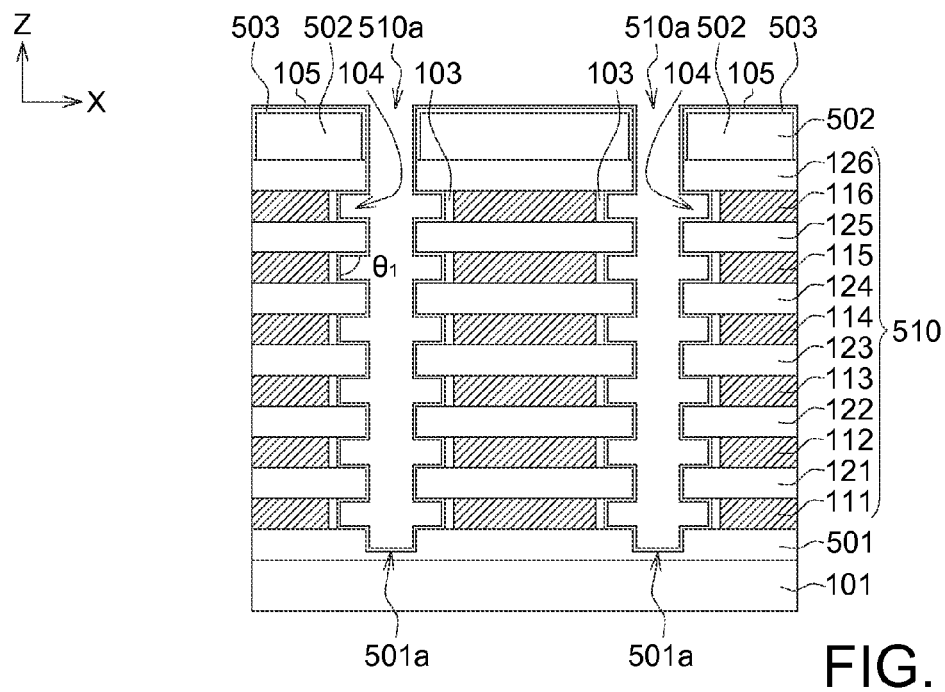
Figure 5F:
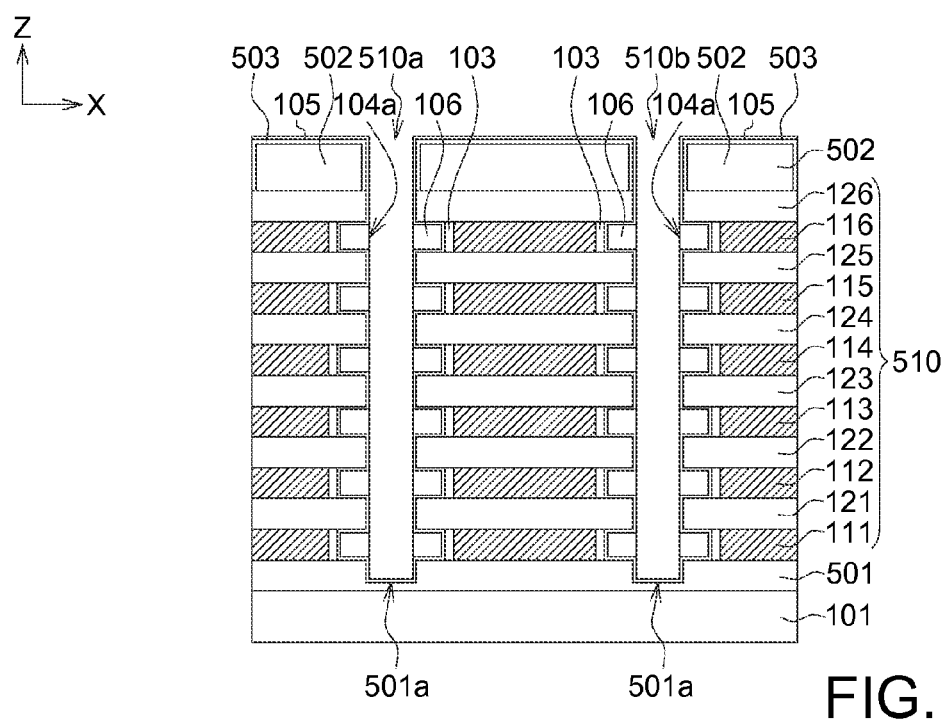
Figure 5G:
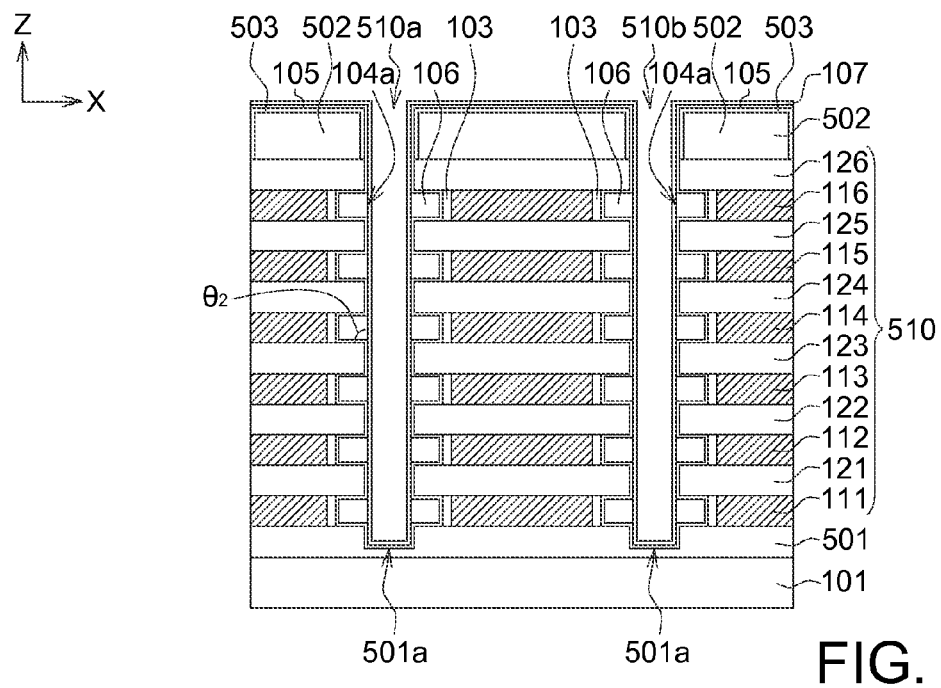
Figure 5H:
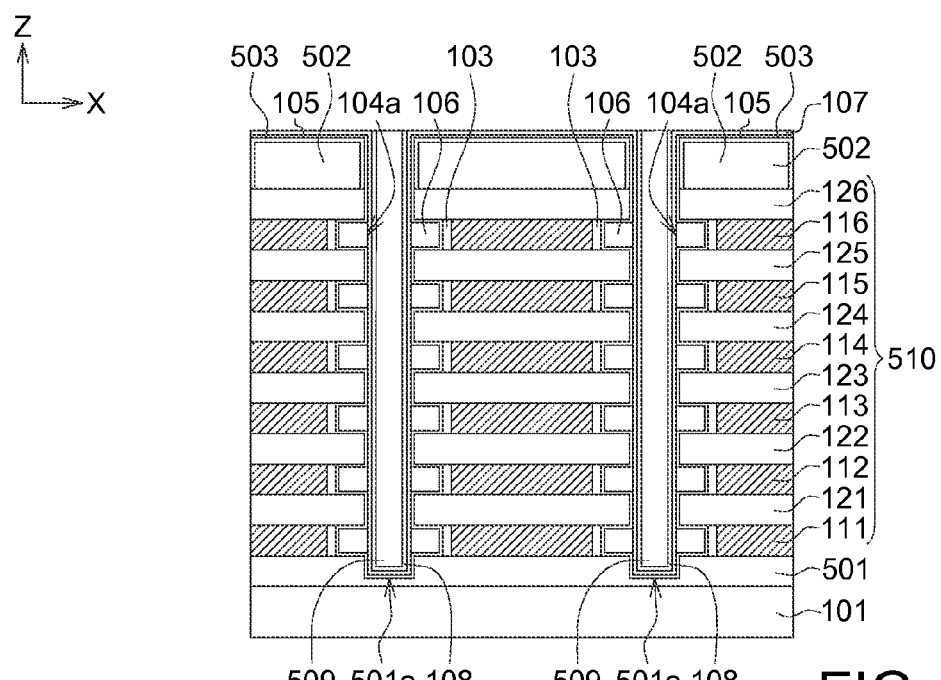
Figure 5I:
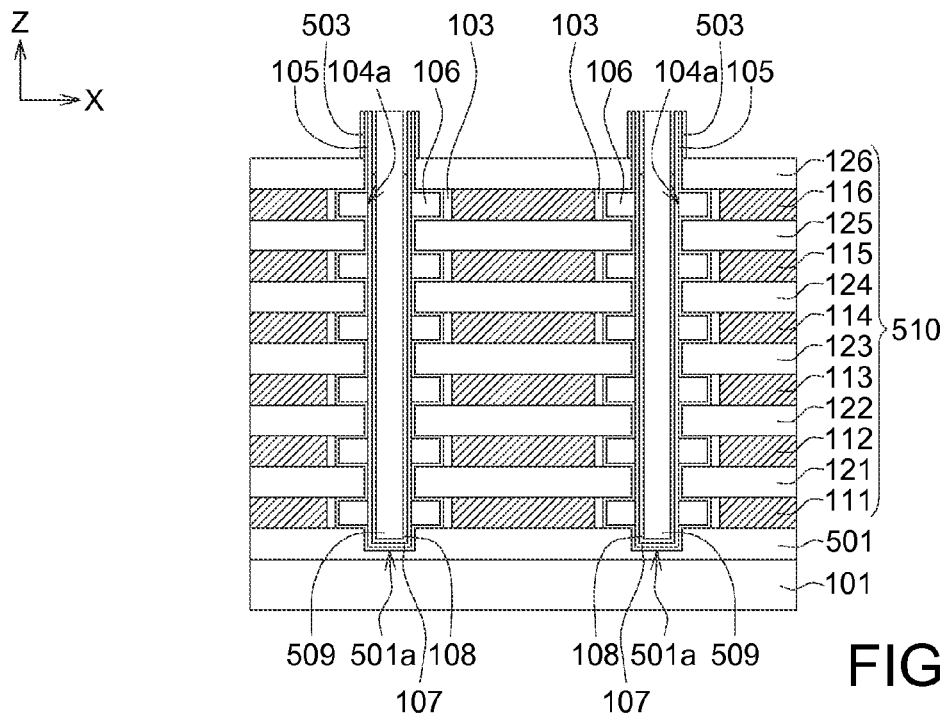
Figure 5J:
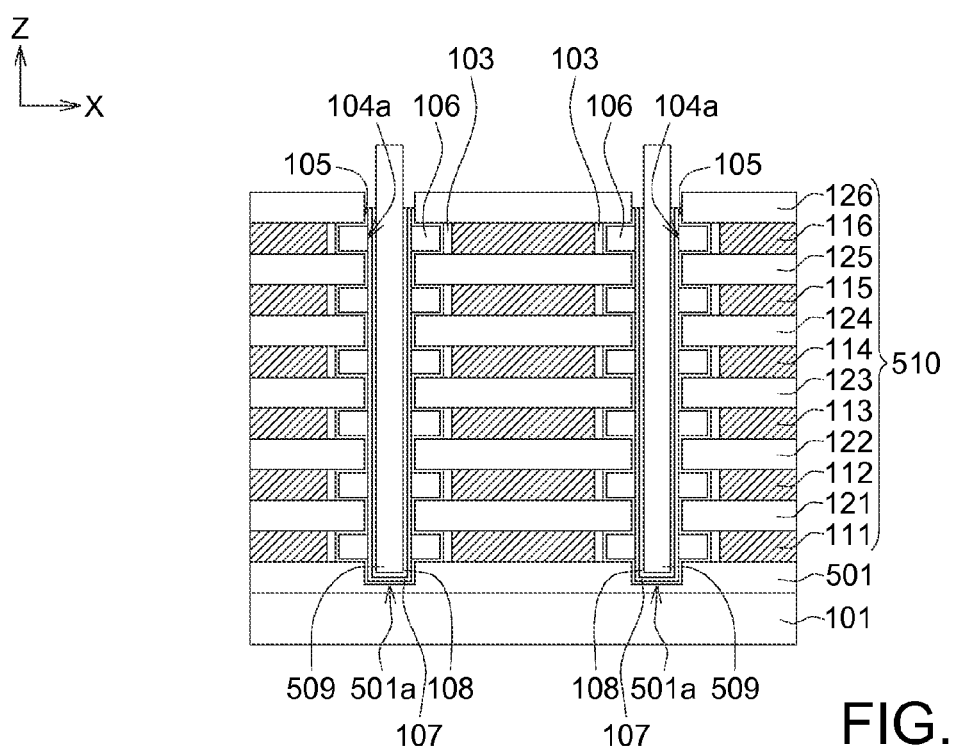
Figure 5K:
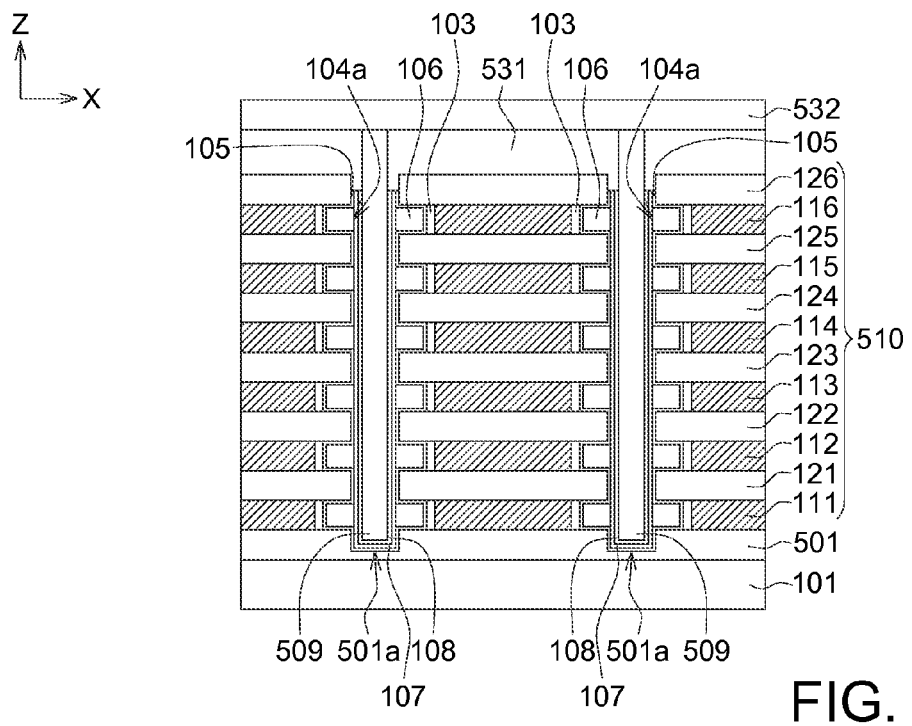

In order to remain the structure of the multilayers stack 110 having the first recesses 104 stable, prior to the forming of the floating gate electrodes 106, an optional nitridation process, such as a plasma nitridation process, can be performed to form a first lining layer 105 covering on the portions of the insulating layers 121-126 exposed from the trenches 510a and 510b as well as the first recesses 104 and covering on the portions of the isolation layers 103 exposed from the first recesses 104 (see FIG. 5E).

After the floating gate electrodes 106 are formed, a tunneling oxide layer 107 may be formed by a deposition process to blanket over the multilayers stack 510 and the sidewalls and the bottom of the trenches 510a and 510b. In the present embodiment, the tunneling oxide layer 107 is comformal with the portions of the insulating layers 121-126 and the floating gate electrodes 106 exposed from the trenches 510a and 510b. In other words, the portion of the tunneling oxide layer 107 blanketing over the sidewalls of the trenches 510a and 510b is disposed on the opening surface 104a of the first recesses 104 and forms a non-straight angle θ2, such as an angle of 90°, with the insulating layers 121-126 (see FIG. 5G).

A channel layer 508 is then formed to conformally covering on the tunneling oxide layer 107 and extending downwards into the recess 501a having a U-shaped cross-sectional profile. After the forming of the channel layer 508, the trenches 510a and 510b are filled by a dielectric material 109, such as SOD. Next, a planarization process, such as a chemical mechanical polish (CMP), using the semiconductor capping layer 502 as a stop layer is performed to remove portions of the dielectric material 509, the channel layer 108, the tunneling oxide layer 107 and the silicon oxide layer 503 disposed on the semiconductor capping layer 502 (see FIG. 5H).

An anisotropic etching process using tetramethyl-ammonium-hydroxide (TMAH) or SC1 solution (the mixed solution of $NH_4OH:H_2O_2:H_2O$) is then performed to remove the semiconductor capping layer 502, so as to expose a portion of the top-most insulating layers 126 of the multilayers stack 510. At the same time, the portion of the channel layer 508 adjacent to the opening surface of the trenches 510a and 510b may be removed, whereby the channel layer 508 has a level measure from the substrate 101 substantially lower than that of the top surface of the insulating layers 126 (see FIG. 5I). The remaining portions of the silicon oxide layer 503 is next removed by an etching process, such as a wet etching process using diluted solution of hydrogen fluoride (HF) (see FIG. 5J). A bond pad layer 531 electrically connected to the channel layer 508 are formed on the insulating layers 126 by a series of deposition process and metal patterning process; and a protection layer 532 is then formed to cover the multilayers stack 510 and the bond pad layer 531 (see FIG. 5K).

Thereafter, a plurality of second through opening (e.g. the through holes 433 as shown in FIGS. 4B1 to 4B3) passing through the multilayers stack 510. The remaining portions of the sacrificing layers 111-116 are next removed from the through holes 433 to form a plurality of the second recess 134 between each two adjacent insulating layers 121-126, and the second recess 134 are then filled with control gate electrodes 135. After a series of BEOL processes (not shown) are carried out, the forming of the memory device 500 as shown in FIG. 5L can be accomplished.

Figure 5L:
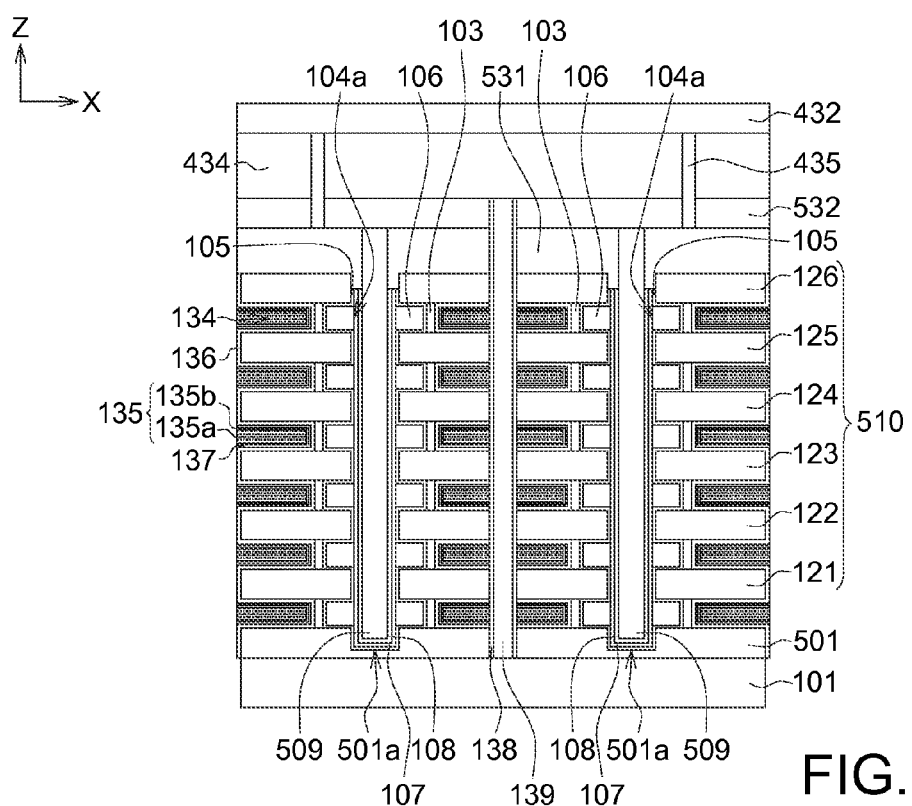

In the present embodiment, the material and processing steps performed on the structure of FIG. 5L to accomplish memory device 500 as shown in FIG. 5L are similar to that depicted in FIG. 4A1 to 4G3, except that the starting structure of the FIG. 5L has a U-shaped channel layer 508 extending into the recess 501a of the bottom insulating layer 501 and electrically insulated from the substrate 101. As discussed above, the similar processing steps are not redundantly repeated.

In accordance with the aforementioned embodiments of the present invention, a memory device and method for fabricating the same are provided, wherein the method includes steps as follows: Firstly, a multilayers stack having a plurality of insulating layers and a plurality of sacrificing layers alternatively stacked with each other is provided. Next, at least one first through opening passing through the multilayers stack is then formed to partially expose the insulating layers and the sacrificing layers. Portions of the sacrificing layer are then removed to form a plurality of first recesses between each adjacent two insulating layers. Next, portions of the remaining sacrificing layer exposed from the first recesses are oxidized to form a plurality of isolation layers in the first recesses, wherein each of the isolation layers forms a non-straight angle with the first insulating layer. Thereafter, a plurality floating gate electrodes are formed to fill the recesses, and at least one tunneling oxide layer and at least one channel layer are formed in sequence on the sidewalls of the first through opening to cover the floating gate electrodes. Subsequently, at least one second through opening passing through the multilayers stack is formed; the remaining sacrificing layers are then removed through the second through opening to form a plurality of second recesses for exposing portions of the isolation layers; and a plurality of control gate electrodes are formed to fill the second recesses. As a result, each of the a floating gate electrode, the insulation layer and the control gate electrode formed between each two adjacent insulating layers can constitute a floating gate structure, and a plurality floating gate cells can be defined at the of intersection points formed by the floating gate structure and the tunneling oxide layer covered with the channel layer.

By using the floating gate structure, the problems of reliability due to the influence of edge and corner effect can be alleviated, and the program/erase reliability of the memory device can be improved. Besides, since the isolation layers are formed by the oxidized sacrificing layers with thin film thickness, thus the gate couple ratio (GCR) of the memory device provided by the embodiments of the present invention can be improved significantly by using the thin film isolation layers as the inter-poly dielectric (IPD) layer of the floating gate structure.

In addition, because the multilayers stack used to form the vertical channel memory device is made of alternatively stacked insulating layers and dielectric sacrificing layers which has similar removing rate during the process for forming the through opening. Better etching profile and deeper depth of the through opening can be obtained. Such that the resulted vertical channel memory device can have more memory capacity than that of the prior art charge trapping flash memory, e.g. the flash memory device using a SONOS structure. The process windows of the vertical channel memory device can be also enlarged. In other words, the memory device formed by the aforementioned method of the present invention can provide better performance without increasing the device size, in comparison with the prior art charge trapping flash memory using a SONOS structure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a memory device, comprising:
providing a multilayers stack having a plurality of insulating layers and a plurality of sacrificing layers alternatively stacked with each other;
forming at least one first through opening passing through the multilayers stack to partially expose the insulating layers and the sacrificing layers;
performing a pull-back etching process to remove portions of the sacrificing layers through the first through opening, whereby a plurality of first recesses are defined by the remaining sacrificing layers and the insulating layers;
partially oxidizing the remaining sacrificing layers to form an insulation layer in each of the first recess;
forming a plurality of floating gate electrodes to respectively fill the first recess;
forming a tunneling oxide layer to cover portions of the insulating layer and the floating gate electrodes exposed from the first through opening;
forming a channel layer on the tunneling oxide layer;
forming at least one second through opening passing through the multilayers stacks to partially expose the insulating layers and the remaining sacrificing layers;
removing the remaining sacrificing layers to expose portions of the isolation layers, whereby a plurality of second recesses are defined by the insulating layers and the isolation layers; and
forming a plurality of control gates to respectively fill in the second recesses.

2. The method according to claim 1, wherein the process of oxidizing the remaining sacrificing layers comprises an in-situ steam generation (ISSG) oxidation process used to transform silicon nitride of the remaining sacrificing layer into silicon oxide to form the isolation layers.

3. The method according to claim 1, further comprising steps of performing a nitridation process to form a first lining layer covering on portions of the insulating layers and the isolation layers exposed from the first recesses, prior to the forming of the floating gate electrodes.

4. The method according to claim 1, wherein the process of forming the floating gate electrodes comprises:
forming a conductive layer to fill the first through opening and the first recesses; and
performing a pull-back etching process to remove portions of the conductive layer disposed in the first through opening.

5. The method according to claim 1, further comprising steps of performing a nitridation process to form a second lining layer covering on portions of the insulating layers and the isolation layers exposed from the second recesses, prior to the forming of the control gate electrodes.

6. The method according to claim 1, wherein the process of forming the control gate electrodes comprises:
forming a gate dielectric layer to blanket over portions of the insulating layer and the isolation layers exposed from the second through opening and the second recesses;
forming a metal layer on the gate dielectric layer, so as to fill the second recesses; and performing a metal pull-back etching process to remove portions of the metal layer and the gate dielectric layer disposed in the second through opening.

7. The method according to claim 1, wherein the first through opening is a through hole, the second through opening is a trench, and tunneling oxide layer and the channel layer are surrounded by the floating gate electrodes and the isolation layers.

8. The method according to claim 7, further comprising steps of filling a dielectric material into the first through opening and forming at least one air gap in the filled first through opening, prior to the forming of the second through opening.

9. The method according to claim 1, wherein the first through opening is a trench, and the second through opening is a through hole.

10. The method according to claim 9, further comprising steps of thoroughly filling the first through opening with a spin-on-dielectric (SOD) material, prior to the forming of the second through opening.

11. The method according to claim 1, wherein the multilayers stack is formed on a common source layer and the channel is electrically contact with the common source layer.

12. The method according to claim 11, further comprising steps of forming a protection layer on the multilayers stack.

13. The method according to claim 1, wherein the multilayers stack is formed on a bottom insulating layer and the channel has a U-shaped cross-sectional profile extending into the bottom insulating layer.

14. The method according to claim 1, prior to the forming of the second through opening, further comprising:
forming a bond pad layer on the multilayers stack and electrically connected to the channel layer; and
forming a protection layer to cover the multilayers stack and the bond pad layer.

* * * * *